US006767219B2

United States Patent
Maruyama et al.

(10) Patent No.: US 6,767,219 B2
(45) Date of Patent: Jul. 27, 2004

(54) CONTACTOR, METHOD FOR MANUFACTURING SUCH CONTACTOR, AND TESTING METHOD USING SUCH CONTACTOR

(75) Inventors: Shigeyuki Maruyama, Kawasaki (JP); Naoyuki Watanabe, Kawasaki (JP); Kazuhiro Tashiro, Kawasaki (JP); Naohito Kohashi, Kawasaki (JP); Osamu Igawa, Kawasaki (JP); Tetsuya Fujisawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/292,839

(22) Filed: Nov. 13, 2002

(65) Prior Publication Data

US 2003/0186566 A1 Oct. 2, 2003

(30) Foreign Application Priority Data

Apr. 1, 2002 (JP) .................................. 2002-099133

(51) Int. Cl.[7] .......................... H01R 12/00; H05K 1/00
(52) U.S. Cl. ....................................... 439/66; 324/754
(58) Field of Search ........................... 439/66, 331, 81; 324/754

(56) References Cited

U.S. PATENT DOCUMENTS

5,917,707 A * 6/1999 Khandros et al. ........... 361/776
6,442,831 B1 * 9/2002 Khandros et al. ............. 29/843

FOREIGN PATENT DOCUMENTS

| JP | 9-505439 | 5/1997 |
| WO | WO 95/14314 | 5/1995 |
| WO | WO 98/11445 | 3/1998 |

OTHER PUBLICATIONS

Patent Abstract of Japan, 2001–118876, (Apr. 27, 2001) * Abstract.

* cited by examiner

*Primary Examiner*—Javaid H. Nasri
(74) *Attorney, Agent, or Firm*—Armstrong, Kratz, Quintos, Hanson & Brooks, LLP

(57) ABSTRACT

A contactor has a contactor substrate and a plurality of contact electrodes formed on the contactor substrate. Each contact electrode is formed by a metal wire bent between one end joined to the contactor substrate and the other end. An inclined plane is formed by a cutting surface. A fracture surface formed by a tension fracture is formed at the apex portion of the contact electrode.

34 Claims, 47 Drawing Sheets

FIG.5A  FIG.5B  FIG.5C
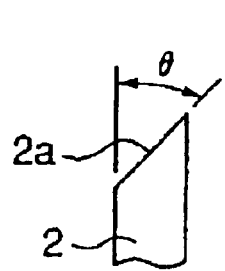 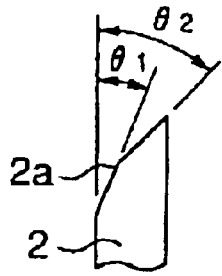 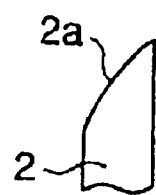
FIG.6A  FIG.6B
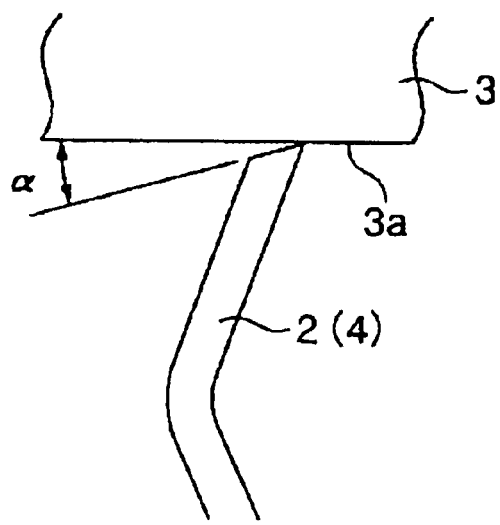 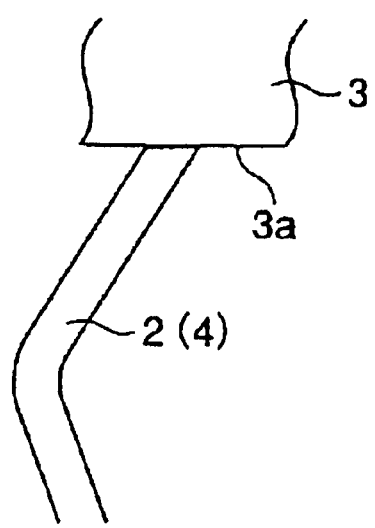

FIG.10A  FIG.10B  FIG.10C
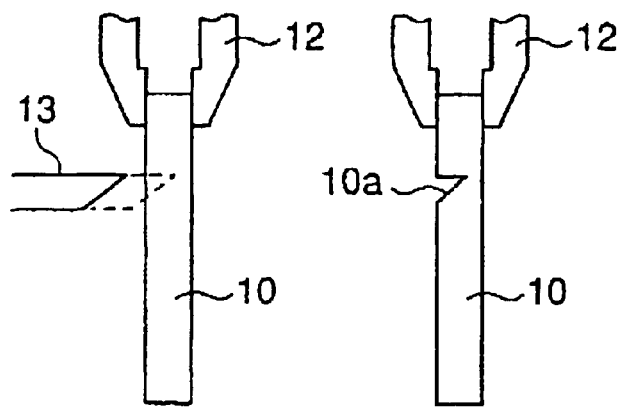
FIG.10D  FIG.10E
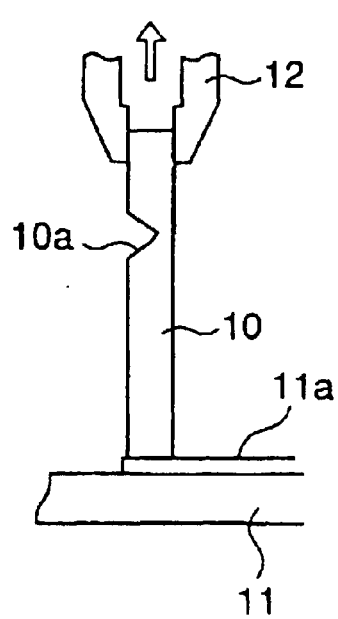
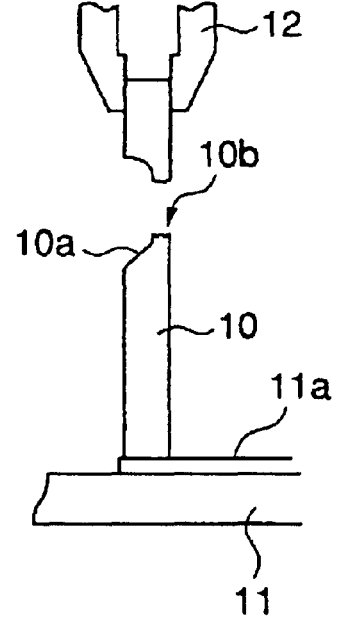

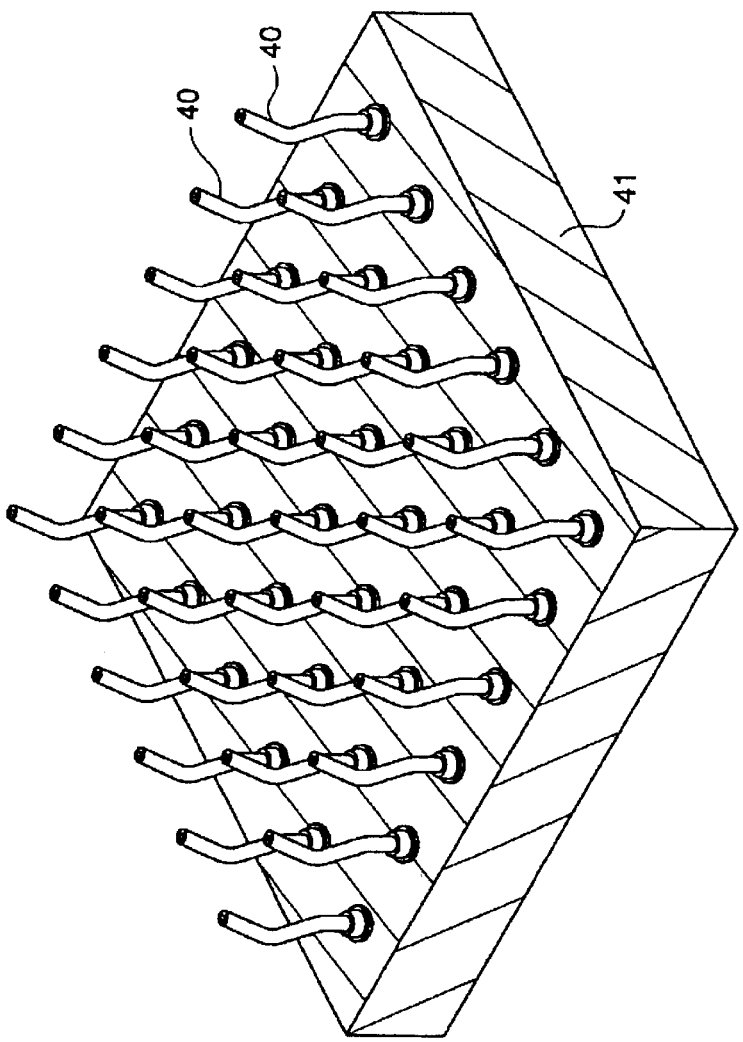

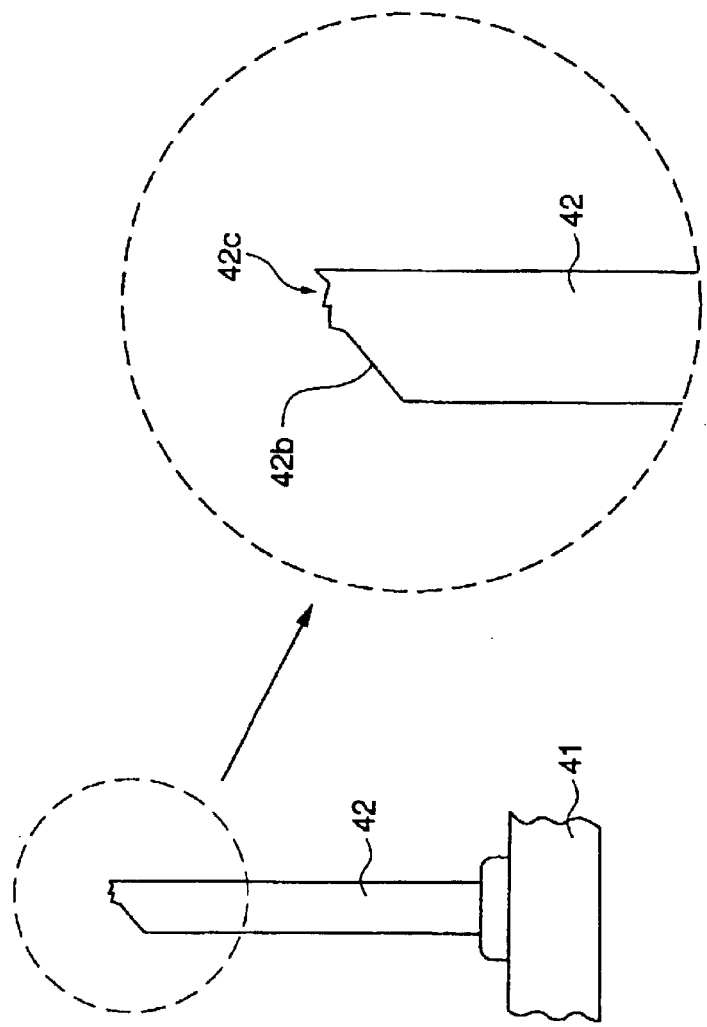

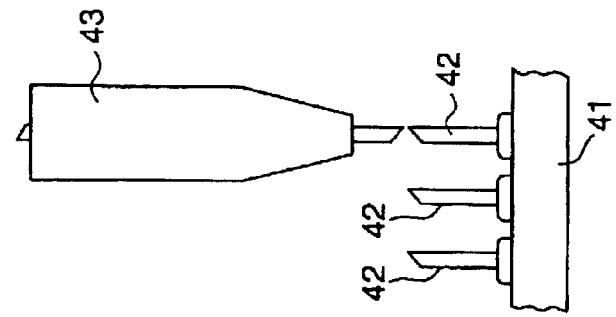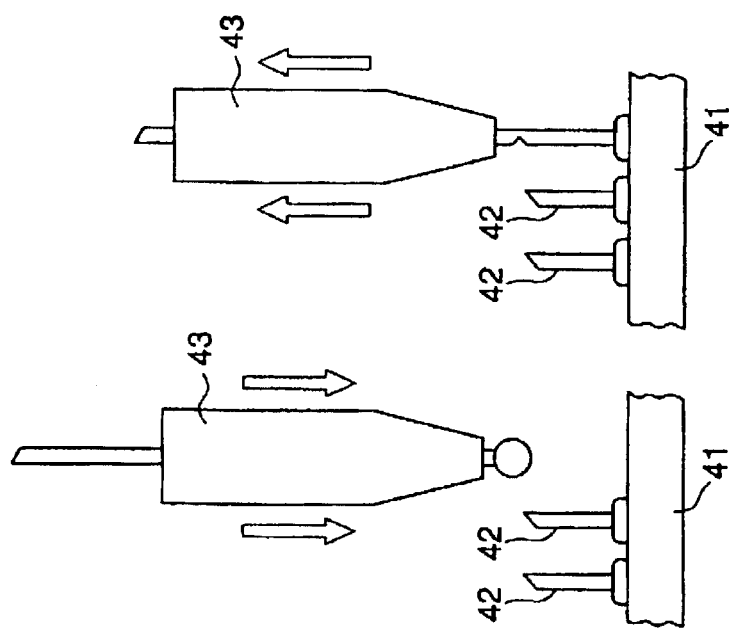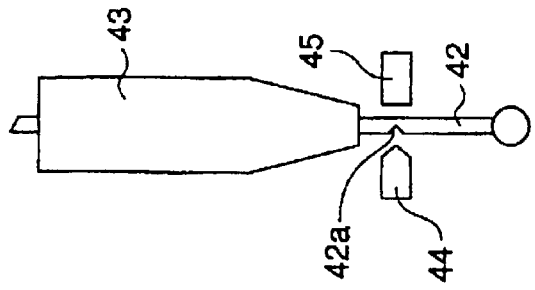

$\alpha = 90 - \theta \, (°)$

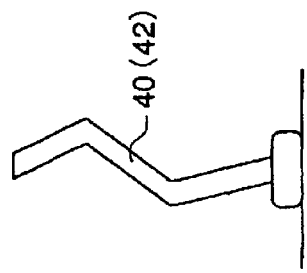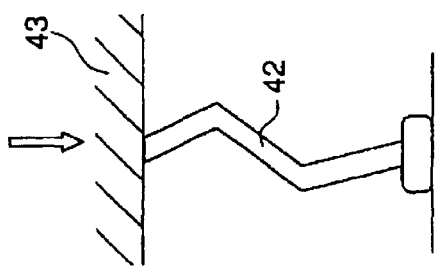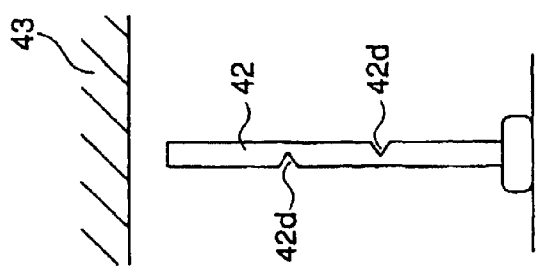

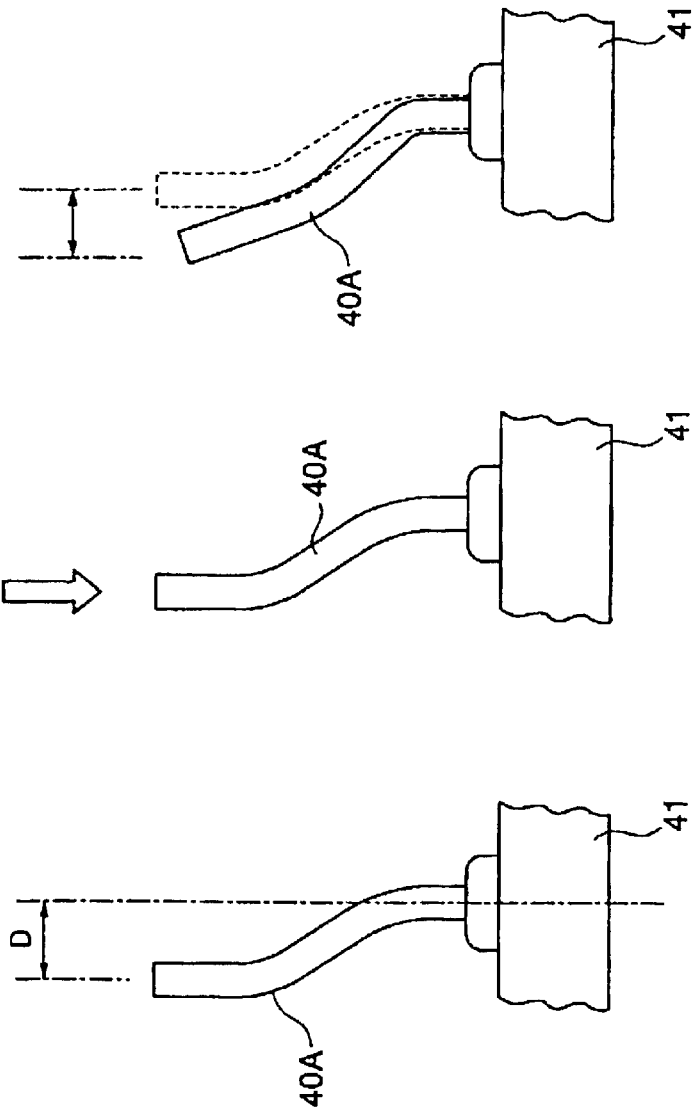

ELECTRONIC COMPONENT (LSI, etc.)

CONTACTOR, METHOD FOR MANUFACTURING SUCH CONTACTOR, AND TESTING METHOD USING SUCH CONTACTOR

BACKGROUND OF THE INVENTION

1. Field of the Invention

The present invention generally relates to a contactor, in particular to a contactor contacting a terminal of a subject to be tested such as a semiconductor substrate (wafer), a wiring substrate, and an electrical component for performing electrical testing, a method for manufacturing such contactor, a method for contacting the wiring substrate using such contactor, and a testing method.

2. Description of the Related Art

Recently, with respect to semiconductor devices represented by an LSI (the semiconductor device is referred to as an LSI hereinafter), in order to accommodate the demands for down-sizing of a product to which the LSI is applied or for multi-functionalization of the product in case the size is the same as a conventional product, the wiring is increasingly arranged in more detail and also the circuit density is increasing. The finer arrangement of the wiring and the increase in the circuit density are accompanied by the increase in the number of terminals and the miniaturization of the terminals. Accordingly, the miniaturization of the contact electrode and the increase in the number of contact electrodes provided on the contactor (probe card) for testing the LSI in a wafer form are also demanded.

Previously, the LSI was usually tested and shipped in a packaged state but in recent years, more LSIs are tested and shipped in so called Known-Good-Die (KGD) state in which the LSI is tested in chip or wafer state without being packaged. The main reason for the sudden increase in the KGD is the increase 1) in the type of usage of so-called "bear chip packaging" in which the semiconductor chip is directly mounted to the substrate of the apparatus without being packaged (for downsizing) and 2) in the type of usage of so-called Multi Chip Module (MCM), or Multi Chip Package (MCP) or System In Package (SIP) in which a plurality of semiconductor chips is incorporated in a single package (for even more downsizing and multi-functionalizing).

In the manufacturing process of a semiconductor device for the type of usage as mentioned above, the testing items implemented in the conventional packaged state need to be implemented in the wafer or chip state. The terminal pitch of the wafer (chip) (mainly under 100 micrometers) with respect to the terminal pitch of the package (mainly 0.5 to 1.27 millimeters) is minute and the terminal size is also accordingly minute. Obviously, the performance of the testing contactor for the wafer is more demanding than that for the packaging.

Further, not only a peripheral terminal, which is predominantly manufactured conventionally, but also the number of manufactured area array terminals is increasing. The peripheral terminal is a pad terminal with an aluminum surface provided about the periphery of the chip for wiring the chip with a wire bond. The area array terminal is a terminal arranged in a grid shape on the chip area and a solder bump is mainly used as terminal material.

For a conventional peripheral terminal, a contact probe with an electrode contacting only the pad terminal arranged on the periphery of the semiconductor device is used. However, for the area array terminal, a contact probe having the ability to contact any position in the chip dimension is necessary.

Testing the LSI in a discrete chip or in a packaged state is referred to as "a discrete testing", whereas testing the LSI in the wafer state before cutting out into small pieces of LSI is referred to as "wafer level testing." The wafer level testing tests the LSI after the wafer process and before the packaging, however, it includes the LSI applied with an additional process after the wafer process, such as the wafer level CSP packaged in the wafer state.

Also, the wafer which has been diced (cut) but still maintains the arrangement prior-to-cutting, due to being loaded on the dicing tape on which each chip is fixed and supported, may be considered to be included in the wafer level testing.

Since the wafer level testing allows the performance of testing without cutting the semiconductor wafer into the chips, the handling efficiency can be improved. Also, even when the size of the chip varies, since the wafer profile is fixed and standardized, testing equipment implementing the wafer level testing has a higher versatility than those implementing the discrete testing.

For the contactor (probe) for the wafer level testing, the following characteristics are required:

A) miniaturization of the terminal: A plurality of contact electrodes enabled to contact minute terminals arranged in narrow intervals is needed.

B) arrangement freedom: The plurality of contact electrodes can be arranged freely. In other words, the contact electrodes may be arranged not only around the periphery area but also as an array (grid). When all contact electrodes are arranged within the chip dimension, the chips adjacent to one another can be tested simultaneously.

C) widening of the contact area: Contact electrodes enabled to contact a plurality of LSIs at a time are required.

D) depressurization: Lessening the force applied to the thinner wafers, for example reducing the contact collective force, which is the summation of contact pressure of each contact electrode, with respect to the increase in the number of simultaneous testing or to increasing the number of pins of the LSI. For example, when the contact pressure of one pin is 10 g, the collective force for 50,000 terminals would add up to 5,000 kg.

E) cost reduction: The life cycle of the LSI wafer itself is becoming shorter. For example, in the case of general-purpose memory, the miniaturization of chips is performed approximately every 6 months and the terminal arrangement on the wafer is also changed. Also, more so-called ASICs specialized for particular customers and products are manufactured among the LOGIC products, and in particular, those for portable device applications have shorter life cycles. In view of the above, for the contactor (probe card) provided for each LSI wafer, the durability is important but also the contactor needs to be provided at a cost that pays off during a limited period of service.

With respect to the above-mentioned requirements, the prior art and the problems related thereto are listed below.

(I) Needle Method

1) Cantilever Method:

In this method, the needle point of a needle is registered with a terminal on the wafer and the other end of the needle is connected to the substrate. The interval of the terminals on the substrate side is larger than that of the terminals on the wafer side. Thus, the cantilever method has a constraint in terms of the terminal arrangement due to the configuration and therefore cannot address the requirement B) mentioned above. Also, this method has a constraint with respect to the requirement C). Therefore, since the terminals cannot be arranged as an area array or the dimension of the probe is larger than that of the chip, there exists a problem that the neighboring chips cannot be contacted simultaneously.

2) Vertical Probe Method:

2-1) Spring Probe (POGO-PIN) Method

With respect to the requirement A), the narrow pitch is structurally limited. In other words, the reduction of winding diameter of the coil spring has a limit. Also, with respect to the requirement D), in the depressurized state, stable contact cannot be obtained since there is no wiping motion so as to break the oxide film of the LSI terminals. Further, with respect to the requirement E), there exists a problem in that the spring probe is expensive due to the structural factors. In other words, it is necessary to wind the coil having a minute diameter separately. Also, a separate high precision boring component is necessary so as to maintain the position precision of the needle point.

2-2) Vertical Needle:

A conductive needle (rod-like member) rising in the vertical direction is set as a contact electrode. With respect to the requirement A), the displacement is caused by buckling and the direction in which the needle will bend cannot be determined in advance. Therefore, neighboring pins may contact and interconnect with each other. With respect to the requirement D), in the depressurized state, stable contact is unlikely to be obtained since there is no wiping motion.

3) Bending Needle Method:

With respect to the requirement A), depending on the degree of the bending, in order to arrange the bending needles at narrow pitches, the neighboring pins may obstruct each other. Also, with respect to the requirement E), the configuration in which each needle is bent individually is expensive.

(II) Membrane Method

With respect to the requirement A), since the contact electrodes are coupled together by an insulation substrate, when the pitch is narrow, the individual electrode cannot move freely. With respect to the requirement C), since the wiring extends between the contact electrodes, the amount of wiring is limited. Multi-layering of the wiring in the membrane method is advanced only to the degree of providing the wiring on both sides of the insulation substrate. With respect to the requirement D), in the depressurized state, stable contact is unlikely to be obtained since there is no wiping motion.

(III) Anisotropic Conductive Sheet (Rubber)

With respect to the requirement A), this sheet cannot accommodate narrow pitches. Also, there exist problems such as lack of heat resistance and durability.

As mentioned above, with the prior art, it is not possible to provide a contactor that meets all the requirements, i.e. A) miniaturization of terminals, B) arrangement freedom, C) widening of the contact area, D) depressurization, and E) low manufacturing cost.

SUMMARY OF THE INVENTION

In view of the problems mentioned above, an object of the present invention is to provide a contactor wherein the contact electrodes incorporating the bending needle method can be arranged at minute pitches and can be manufactured with low cost, and a method of manufacturing such contactor.

The contactor according to the present invention includes a wiring substrate and a plurality of contact electrodes formed on the wiring substrate. Each of the plurality of contact electrodes is a rod-like member with one end joined to the wiring substrate and the other end having at least two inclined planes, and an apex formed by the inclined planes deviating from the center of the cross-section of the rod-like member.

According to the present invention, when the plurality of the contact electrodes is brought into contact with a subject to be tested (for example, a semiconductor device), the contact electrode having two inclined planes buckles and deforms following the incline of the larger inclined plane among the two inclined planes. Therefore, it is possible to bend a plurality of contact electrodes in the same direction at the same time and thus even when the plurality of contact electrodes is arranged at narrow pitches, the contact electrodes do not contact one another.

To form two inclined planes having different dimensions is easy. For example, it can be achieved by making cuts to the rod-like member with two cutting tools. At this time, the displacement of the cutting tools is controlled so that one of the cuts is deep and the other one of the cuts is shallow thereby forming the two inclined planes with different dimensions. The two inclined planes having different dimensions may be achieved using two cutting tools having different cutting edge angles or having different thicknesses.

According to the present invention, the apex formed by the at least two inclined planes at the other end of each of the plurality of contact electrodes may comprise a cutting surface formed by the cuts and a fracture surface formed by tension fracture.

According to the present invention, since each of the plurality of contact electrodes has the one end joined to the wiring substrate and the other end comprising the inclined planes formed by the cutting surface and the fracture surface, each of the plurality of the contact electrodes may buckle and bend following the inclined plane formed by the cutting surface. Therefore, it may be possible to prevent the neighboring contact electrodes from contacting one another.

According to the present invention, each of the plurality of contact electrodes may be a bent rod-like member.

According to the present invention, the contact electrode may be obtained by depressing a depressing jig with a flat surface from above before placing the contact electrode in contact with the subject to be contacted and buckling the rod-like member to a certain direction with respect to the inclined plane. Thus, when the contact electrode contacts the subject to be contacted, even with small pressure, the contact electrode may deform in the direction to which the contact electrode is already buckled and deformed.

According to the present invention, the fracture surface of each of the plurality of contact electrodes may be a portion located farthest from the one end joined to the wiring substrate.

According to the present invention, the fracture surface may be located at the apex portion of the rod-like member and the inclined plane may extend downward from the fracture surface. In other words, by forming the cut at the position corresponding to the inclined plane and cutting off (fracturing) the rod-like member by tension after joining the rod-like member to the wiring substrate, the plane made by the cut may become the inclined plane and the fracture surface may be formed at the apex portion of the inclined plane.

According to the present invention, the rod-like member may be a non-conductive member having a conductive coating formed at its surface.

According to the present invention, the non-conductive member may be used as the rod-like member and thus a contact electrode with various characteristics may be created.

According to the present invention, the rod-like member may be a metal wire and the metal wire may have a conductive coating formed at its surface.

According to the present invention, metal wire for wire bonding, for example, may be used as the rod-like member. In such a case, a wire-bonding device may be used to easily join the contact electrode to the wiring substrate. Also, by changing the type or the thickness of the conductive coating, a conductive electrode with various characteristics may be created.

According to the present invention, the position of the other end of each of the plurality of contact electrodes may be displaced by a predetermined distance in a direction parallel to the surface of the wiring substrate with respect to the position of the one end joined to the wiring substrate.

According to the present invention, when the apex portion of the contact electrode is depressed, the apex portion may move along an oscillating path. By doing so, a so-called wiping motion where the apex portion of the contact electrode moves over the contacting portion of the subject to be tested may be achieved and thus a good contact may be obtained.

The method of manufacturing a contactor according to the present invention comprises the steps of: joining one end of each of a plurality of conductive rod-like members, having the other end formed with an inclined plane, to a wiring substrate; and depressing the apex portion of the inclined plane with a flat surface of a depressing member so as to bend the plurality of conductive rod-like members, thereby forming a plurality of contact electrodes.

According to the present invention, by depressing the apex portion of the inclined plane with the flat surface of the depressing member, the plurality of the rod-like members may be buckled to a determined direction with respect to the inclined plane. The plurality of contact electrodes formed in such method may be arranged at narrow pitches. Also, since the plurality of contact electrodes has a small spring constant, they are suitable for testing a semiconductor device having narrow-pitched electrodes or a semiconductor device of the wafer level.

According to the present invention, the method may further comprise a step of forming a cut on the conductive rod-like member. The step of forming the cut may be performed at a position different from the position where the step of joining the conductive rod-like member to the wiring substrate is performed.

According to the present invention, since the conductive rod-like member is joined to the wiring substrate after the cut is formed on the conductive rod-like member, the interference by the cutting tool to the conductive rod-like members already joined to the wiring substrate may be prevented.

According to the present invention, each apex portion of the plurality of conductive members may be depressed by the depressing member, each apex portion being inserted in a corresponding concave portion provided in the depressing member.

According to the present invention, since the plurality of the rod-like members is bent having the position of each apex portion of the plurality of rod-like members controlled by the position of the corresponding concave portions of the depressing member, the apex portion of the rod-like member may be arranged with high accuracy.

BRIEF DESCRIPTION OF THE DRAWINGS

Other objects, advantages, and further features of the present invention will become more apparent as the description proceeds taken in conjunction with the accompanying drawings in which:

FIG. 5A through FIG. 5C are diagrams showing shapes of apex portions of bending needles;

FIG. 6A and FIG. 6B are diagrams illustrating the bending process by a bending jig;

FIG. 10A through FIG. 10E show diagrams illustrating the process of forming the contact electrode shown in FIG. 9;

FIG. 28 is a perspective view of a contactor in a second embodiment according to the present invention;

FIG. 31A is a side elevation of a metal wire;

FIG. 31B is an enlarged view of the apex portion of the metal wire;

FIG. 33A through FIG. 33D are diagrams illustrating the process of forming a plurality of metal wires on a contactor substrate;

FIG. 40A through FIG. 40C are diagrams illustrating the process shown in FIG. 39A through FIG. 39C with provision of two cuts in the metal wire;

FIG. 45A through FIG. 45C are diagrams illustrating examples in which the apex portion of a contact electrode performs an oscillating movement;

DETAILED DESCRIPTION OF THE PREFERRED EMBODIMENTS

The following is a description of the preferred embodiments of the present invention with reference to the drawings.

Figure 1:
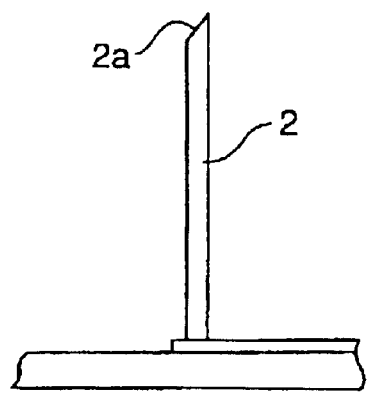
FIG. 1 shows a side elevation of a vertical needle before being bent by a bending method according to the present invention.
Figure 2:
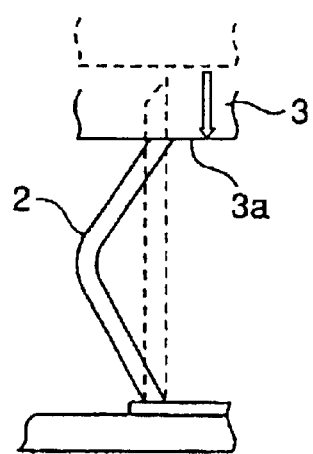
FIG. 2 shows a side elevation of a vertical needle in the bending process by a bending method according to the present invention.
Figure 3:
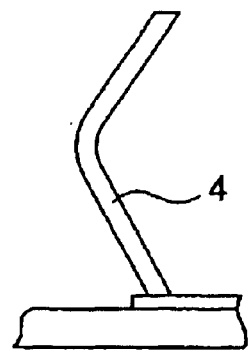
FIG. 3 shows a side elevation of a bending needle after being bent by a bending method according to the present invention.

The present invention employs a bending needle (an elongated rod-like conductive member with a bent shape) as a contact electrode of a contactor and relates to the technology of easily bending a vertical needle uprisingly fixed on a substrate into a uniform shape. FIG. 1 shows a side elevation of the vertical needle before being bent by the bending method according to the present invention. FIG. 2 shows a side elevation of the vertical needle in a bending process by the bending method according to the present invention. FIG. 3 shows a side elevation of the bending needle after being bent by the bending method according to the present invention.

As shown in FIG. 1, the apex portion of the vertical needle 2 before being bent is inclined and thus an inclined plane 2a is formed. By depressing the apex portion of the vertical needle 2 by a depressing jig 3, the vertical needle buckles and deforms as shown in FIG. 2. After removing the depressing jig 3, the vertical needle 2 is permanently deformed to a bending needle 4 as shown in FIG. 3.

The present inventors, etc. have found that in the bending process as shown in FIG. 2, the bending direction of the vertical needle 2 always corresponded to the inclining direction of the inclined plane 2a of the vertical needle 2. In other words, when the depressing jig 3 having a depressing plane 3a perpendicular to the longitudinal axis of the vertical needle 2 is depressed against the apex portion of the vertical needle 2, the vertical needle 2 bends in such manner that the inclined plane 2a follows the depressing plane 3a of the depressing jig 3. Ultimately, the vertical needle 2 buckles in this bending direction and is permanently deformed.

Figure 4:
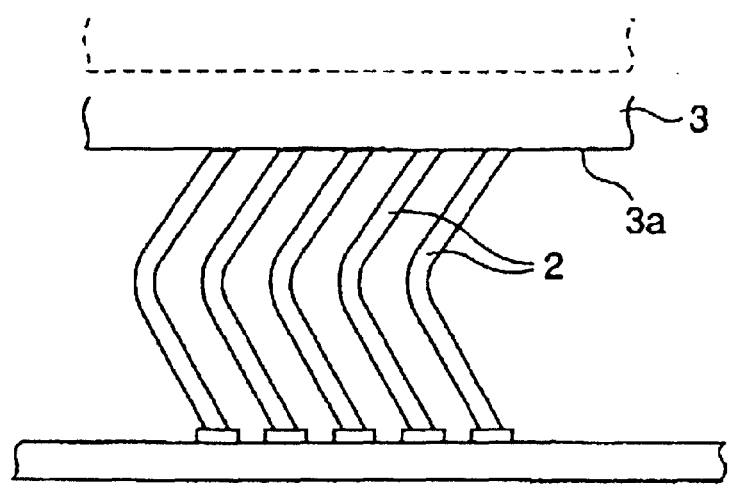
FIG. 4 is a diagram illustrating a process of forming a plurality of bending needles by a bending method according to the present invention.

Therefore, as shown in FIG. 4, it is possible to bend a plurality of vertical needles 2 simultaneously and form a plurality of bending needles 4. At this moment, when the inclined plane 2a of each vertical needle is inclined to the same direction, all the vertical needles buckle in the same direction. Thus all the vertical needles deform into the same bending shape and no neighboring vertical needles 2 contact one another.

By doing so, it is possible to form the plurality of the bending needles 4 in a single process by bending/deforming the plurality (the multiple) of vertical needles 2 using one depressing jig 3, and it is also possible to bend/form the plurality of vertical needles arranged at minute intervals (pitches) with little difficulty and low cost.

It is to be noted that in the following embodiments, the inclined plane 2a is simply defined as a plane with an inclining angle theta as shown in FIG. 5A, however, the inclined plane 2a may be a plane with a multiple inclining angles such as shown in FIG. 5B where the inclined plane has a two-stepped incline with an angle theta 1 and an angle theta 2. Also, the inclined plane 2a may instead be a rounded surface as shown in FIG. 5C. The angle and the shape of the inclined plane are selected accordingly and appropriately depending on the material of the vertical needle 2 and the shape to be bent into.

Also, by controlling the depressing degree (amount) of the depressing jig 3, it is possible to control the bending degree (amount) of the bending needle 4. In other words, by halting the depression of the depressing jig 3 before the inclined plane 2a contacts the depressing plane 3a completely as shown in FIG. 6A, when the bending needle 4 is formed as a clean bending needle 4, the apex portion of the bending needle is inclined at only angle alpha. In practice, there is a spring back since the vertical needle 2 has some resilience and in order to obtain the angle alpha, it is necessary to decide the descending position of the depressing jig taking into consideration the spring back. For example, when it is decided that the depressing plane 3a of the depressing jig 3 is to surface-contact the inclined plane 2 as shown in FIG. 6B, the angle alpha may be obtained by the spring back.

Figures 7A, 7B:
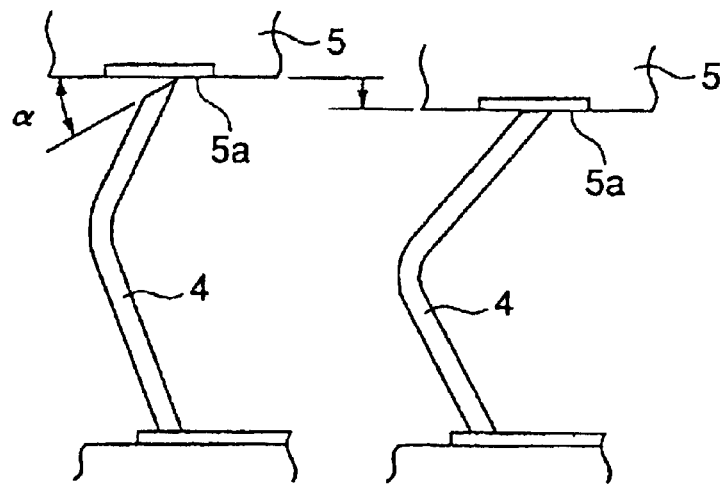
FIG. 7A and FIG. 7B are diagrams illustrating a contacting state between the apex portion of a bending needle and a subject to be contacted.

When the surface of the apex portion of the bending needle 4 is inclined at the angle alpha, the pointed edge of the apex portion of the bending needle 4 contacts an electrode pad 5a of a semiconductor device 5 (a subject to be tested) as shown in FIG. 7A, after which, the semiconductor device 5 descends further down and the inclined plane 2a contacts the electrode pad 5a completely as shown in FIG. 7B. In such an operation, even when a thin oxide film such as a natural oxide film is formed on the surface of the electrode pad 5a, the pointed edge of the apex portion of the bending needle 4 serves to break the oxide film and a good contact can be obtained.

Figure 8:
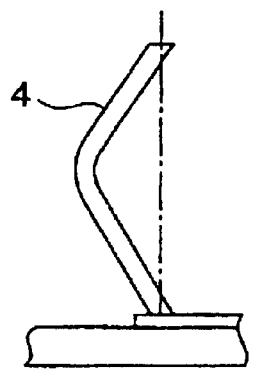
FIG. 8 is a diagram illustrating a position relation of the apex portion and the root portion of a bending needle.

It is to be noted that when a straight vertical needle 2 is depressed by the depressing jig 3, the vertical needle 2 buckles and bends approximately at the midpoint of the needle. At this moment, the root portion and the apex portion of the vertical needle 2 bend maintaining the same horizontal coordinate positions. Therefore, as shown in FIG. 8, the root portion and the apex portion of the formed bending needle 4 are situated on the same perpendicular line. In other words, the horizontal coordinate positions of the root portion and the apex portion of the bending needle 4 are maintained in the same positions. The contact electrode in the form of such bending needle 4 does not exhibit displacement in the horizontal direction of the apex portion during the contact operation.

The following is a description of a contactor in a first embodiment according to the present invention.

Figure 9:
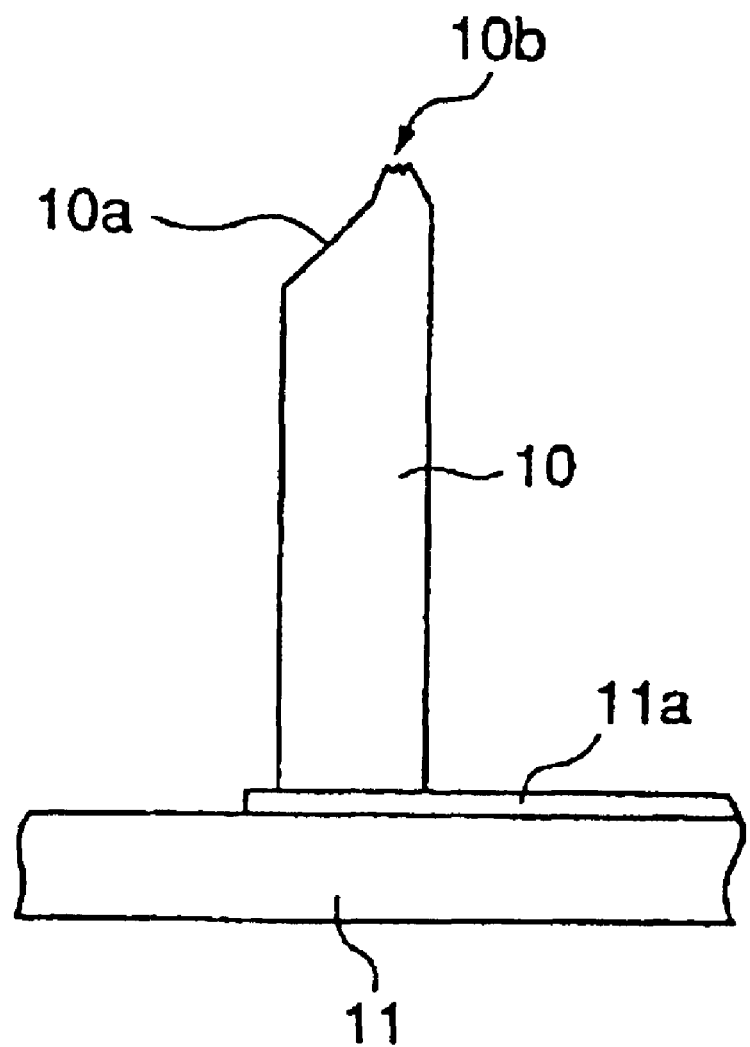
FIG. 9 shows a side elevation of a contact electrode, before being bent, provided on a contactor in a first embodiment according to the present invention.

FIG. 9 shows a side elevation of a contact electrode provided on the contactor in the first embodiment according to the present invention before being bent. The contact electrode 10 of the first embodiment according to the present invention is formed by a rod-like conductive member of metal such as copper, gold, and aluminum. The contact electrode 10 has one end joined to an electrode pad 11a formed on a contactor substrate 11 and is uprising on the contactor substrate 11 before bending.

As shown in FIG. 9, the contact electrode 10 according to the first embodiment has an inclined plane 10a and is buckled and bent by the depressing jig as mentioned above. The inclined plane 10a, as mentioned hereinafter, is a plane formed by a cut of a cutting tool and has a flat surface with a predetermined angle. A fracture surface 10b is formed at the apex portion of the inclined plane 10a. The fracture surface 10b is a surface fractured by tension and resulting small irregularities are formed on the surface.

FIG. 10A through FIG. 10E are diagrams illustrating the process of forming the contact electrode 10 having the fracture surface 10b as mentioned above.

As shown in FIG. 10A, a rod-like member to be formed into the contact electrode 10 is held by a retainer 12 and the cutting tool 13 having an angle corresponding to the angle of the inclined plane 10a is forced against the rod-like member and a cut is formed. When the cutting tool 13 is removed, the inclined plane 10a is formed as shown in FIG. 10B. At this stage, a part of the rod-like member is remaining at the cutting portion and the rod-like member is still held by the retainer 12.

As shown in FIG. 10C, one end (the root portion) of the rod-like member is joined to the electrode pad 11a of the contactor substrate 11. This joint may be formed as a thermal joint, a metal joint such as soldering and brazing, etc., or by adhesion by conductive resin, etc. After the rod-like member and the electrode pad 11a are joined together with sufficient strength, the retainer 12 is displaced so as to pull the rod-like member in the longitudinal direction thereof as shown in FIG. 10D. At this time, the remaining portion at the cutting portion is plastic-deformed since the cut has weakened the rod-like member, and is fractured due to the tension as shown in FIG. 10E. Thus, the fracture surface 10b is formed.

It is noted that in the process of forming the contact electrode 10 shown in FIG. 10A through FIG. 10E, the cut is made before the rod-like member is joined to the electrode pad 11a of the contactor substrate 11. By doing so, it is not necessary to force the cutting tool 3 against the contact electrode 10 after the plurality of the contact electrodes are joined to the plurality of the electrode pads at minute pitches and thus the cutting tool 13 does not interfere with the other contact electrodes 10 already joined to the electrode pad.

Figure 11:
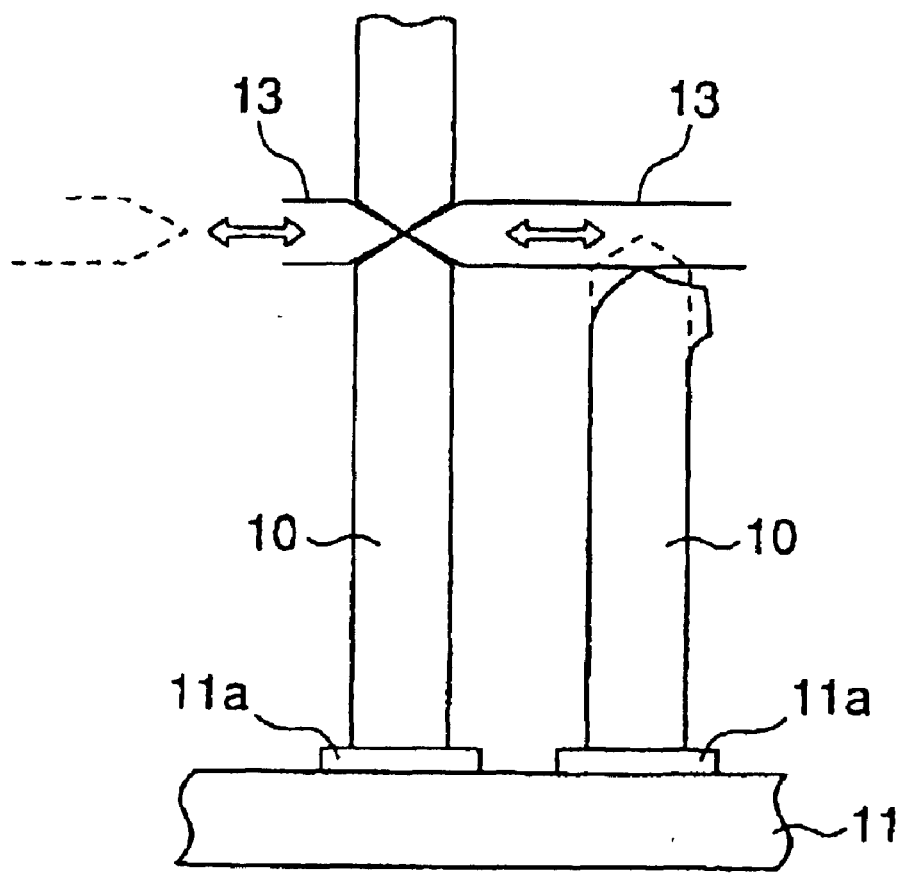
FIG. 11 is a diagram illustrating the interference of a cutting tool with other contact electrodes already formed.

For example, as shown in FIG. 11, in the case when the contact electrode 10 is cut from both sides by the cutting tool 13, the cutting tool 13 may interfere with a neighboring contact electrode 10 already joined to the electrode pad and formed. However, by cutting from only one side of the contact electrode 10 as in the first embodiment according to the present invention, such interference can be prevented.

Figures 12A, 12B, 12C:
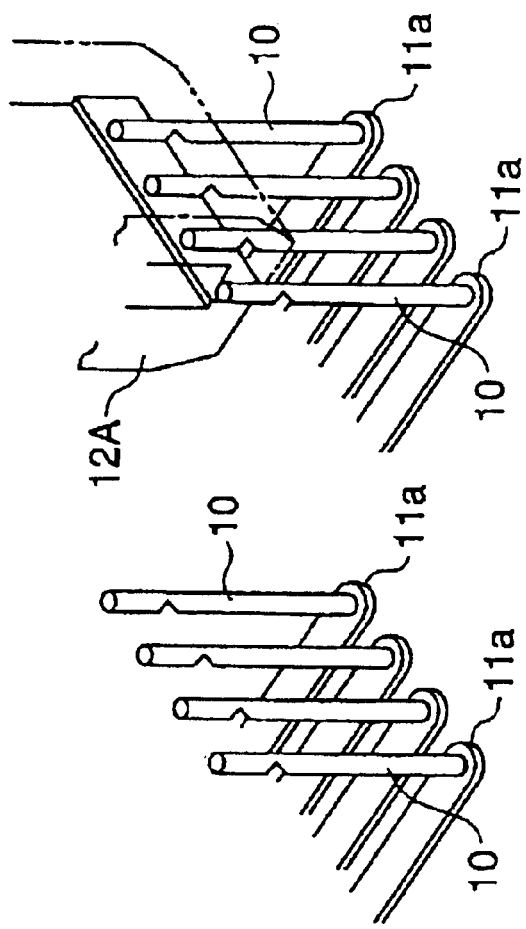
FIG. 12A through FIG. 12C are diagrams illustrating a method of forming a plurality of contact electrodes simultaneously.

FIG. 12A through FIG. 12C are diagrams illustrating the process shown in FIG. 10A through FIG. 10E that is applied to the plurality of contact electrodes 10 simultaneously. As shown in FIG. 12A, the plurality of the contact electrodes 10 are joined to the plurality of the electrode pads 11a. Then as shown in FIG. 12B, the plurality of the contact electrodes 10 formed into a line are held tight simultaneously by a retainer 12A and are tensioned. As shown in FIG. 12C, the plurality of the contact electrodes 10 having fracture surfaces are formed simultaneously. This process is especially effective when, for example, conductive adhesives, etc. are used to join the contact electrode to the electrode pad and thus a curing time of the adhesive is necessary or a heat treatment is necessary for the curing.

The apex portion of the rod-like member (the contact electrode 10) joined on the electrode pad 11a of the contactor substrate 11 as mentioned above is depressed by the depressing jig such as one shown in FIG. 4 and the member is bent into the final contact electrode 10. Since the contact electrode 10 according to the first embodiment has the inclined plane 10a at the apex portion formed by the cut, the contact electrode 10 can be easily and uniformly bent and deformed by the depressing of the depressing tool. Therefore, it is possible to easily and simultaneously form the plurality (the multiple) of the contact electrodes arranged at minute pitches and thus to reduce the manufacturing cost of the contactor.

Also, since the contact electrode 10 according to the first embodiment has the fracture surface 10b at the apex portion thereof, the fracture surface 10b with some irregularities first contacts the electrode of the subject to be tested and a good contact can be obtained.

The following is a description of various modifications of the embodiments according to the present invention with reference to the drawings.

Figure 13A:
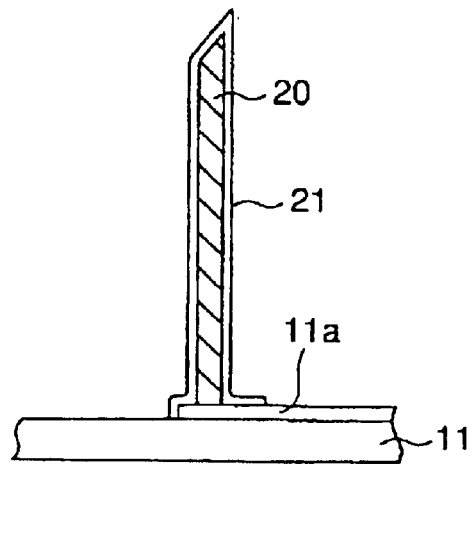
FIG. 13A through FIG. 13C are cross sections of a contact electrode formed of a non-conductive material.
Figure 13B:
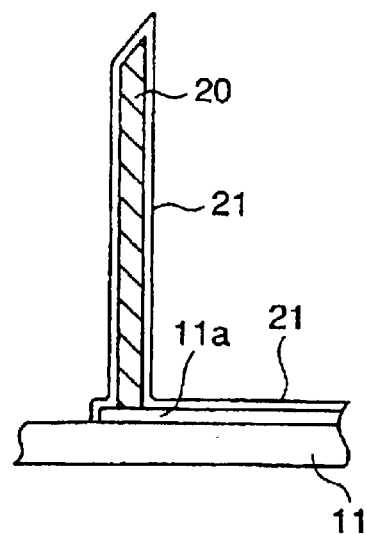
Figure 13C:
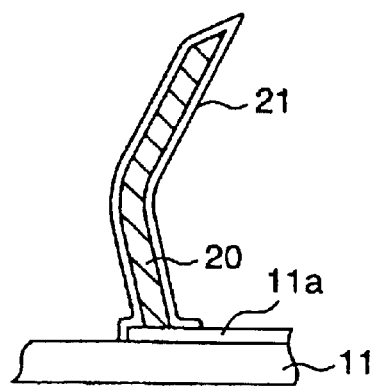

FIG. 13A through FIG. 13C are side cross sections of a contact electrode, the rod-like member of which is formed by a non-conductive material and a conductive coating is applied thereon. In other words, the non-conductive materials such as resin or hard rubber is used as the rod-like member and the conductive coating is formed on the surface of the contact electrode after the contact electrode is joined to the electrode pad 11a.

In an example shown in FIG. 13A, the conductive coating 21 is applied by plating or coating of the conductive material after the non-conductive rod-like member 20 is joined to the electrode pad 11a. The conductive coating 21 is applied over the surface of the rod-like member 20 and a part of the electrode pad 11a. In an example shown in FIG. 13B, the conductive coating 21 is extended from the electrode pad 11a to the wiring portion. Also, in an example shown in FIG. 13C, the conductive coating 21 is applied after the rod-like member 20 is bent.

Figure 14:
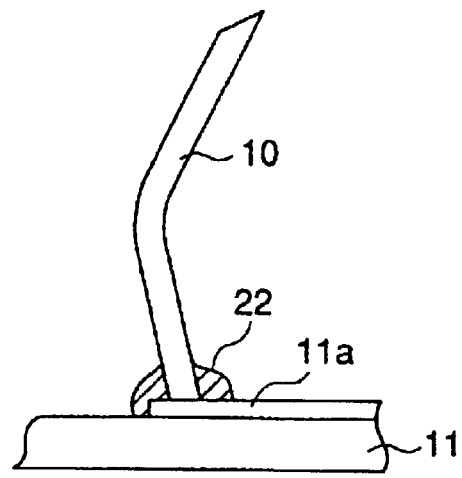
FIG. 14 is a diagram illustrating an example in which resin is provided at the joining portion of a contact electrode formed by a conductive rod-like member so as to reinforce the joining portion.

FIG. 14 shows an example in which resin is provided at the joint portion (the root portion) of the contact electrode 10 formed by the conductive rod-like member so as to reinforce the joint portion. Since stress concentrates at the root portion of the contact electrode 10 when making contact with the subject to be tested, a member 22 made of resin or rubber, etc. is provided at the root portion of the contact electrode 10 so as to prevent breakage.

Figure 15:
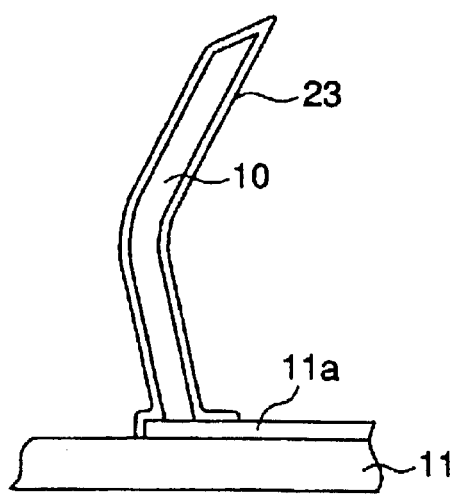
FIG. 15 is a diagram illustrating an example in which a reinforcing coating is applied to the surface of a contact electrode.

FIG. 15 shows an example in which all portions including the joint portion of the contact electrode 10 are reinforced by forming a coating 23 on the surface of the contact electrode 10. As for the coating 23, nickel (Ni) plating, nickel (Ni)+ gold (Au) plating, nickel (Ni)+rhodium plating, etc., is employed.

Figure 16:
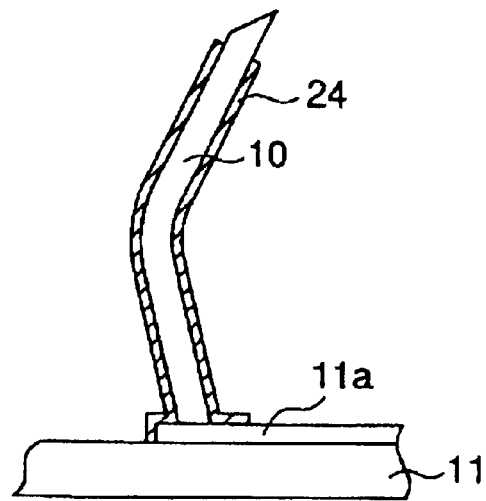
FIG. 16 is a diagram illustrating an example in which a non-conductive coating 24 is applied to the surface of a contact electrode.

FIG. 16 shows an example in which a non-conductive coating 24 is applied on the surface of the contact electrode 10. In this example, the coating 24 is applied to the surface of the contact electrode so that only the apex portion thereof is left exposed. When the plurality of the contact electrodes 10 are arranged at narrow pitches and even when the neighboring contact electrodes contact each other, it is possible to prevent an electrical short circuit. Additionally, even when a conductive foreign substance gets caught between the contact electrodes, it is possible to prevent an electrical short circuit between the contact electrodes.

Figure 17A:
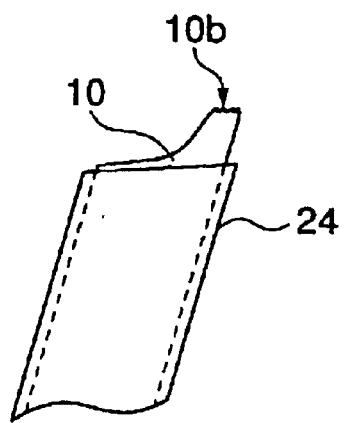
FIG. 17A and FIG. 17B are diagrams illustrating a method of exposing the apex portion of a coated contact electrode.
Figure 17B:
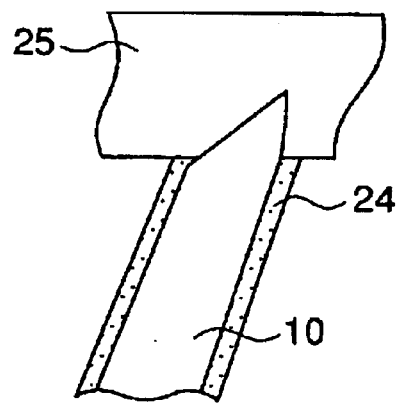
Figure 18A:
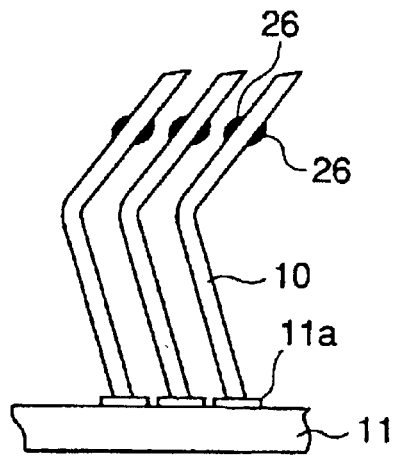
FIG. 18A through FIG. 18D are diagrams illustrating examples in which a non-conductive protrusion 26 is formed on a portion of a contact electrode.
Figure 18B:
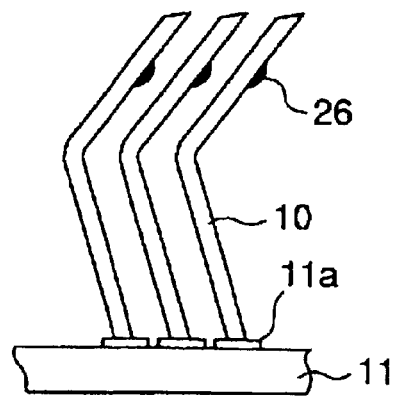
Figure 18C:
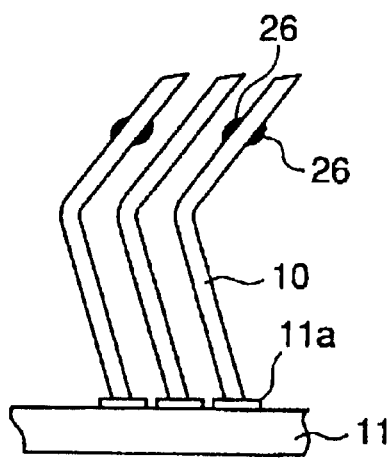
Figure 18D:
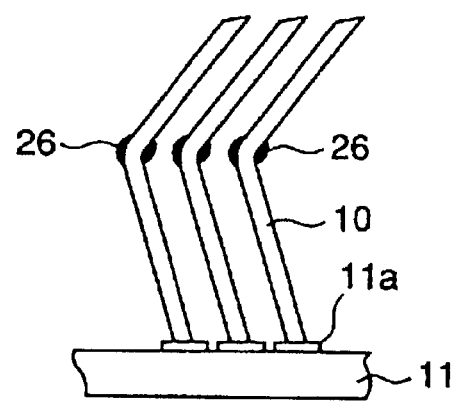

In order to expose only the apex portion of the contact electrode as shown in FIG. 16, the coating 24 may be applied to the surface of the contact electrode before the fracturing by tension. Then, by fracturing the rod-like member by tension after a cut is made in the rod-like member, the portion stretched out is exposed as shown in FIG. 17A. Also, as shown in FIG. 17B, by covering the apex portion of the rod-like member after being fractured with a soft sheet material 25 and then applying the coating 24 to the surface of the contact electrode, the apex portion of the contact electrode is exposed when the material 25 is removed. Also, a part of the coating 24 may be melted and removed in advance.

FIG. 18A through FIG. 18D show examples in which a non-conductive protrusion 26 is formed on only a part of the contact electrode 10. The protrusion 26 is made from a non-conductive material such as resin and rubber, and is provided for preventing the neighboring contact electrodes 10 from contacting one another. In the example shown in FIG. 18A, the protrusion 26 is provided on both sides of the bending direction of each contact electrode 10. In the example shown in FIG. 18B, the protrusion 26 is provided on one side of the bending direction of each contact electrode 10. In the example shown in FIG. 18C, the protrusion 26 is provided on both sides of the bending direction of every other electrode 10. In the example shown in FIG. 18D, the protrusion 26 is formed at the bending portion of each contact electrode 10.

Figure 19A:
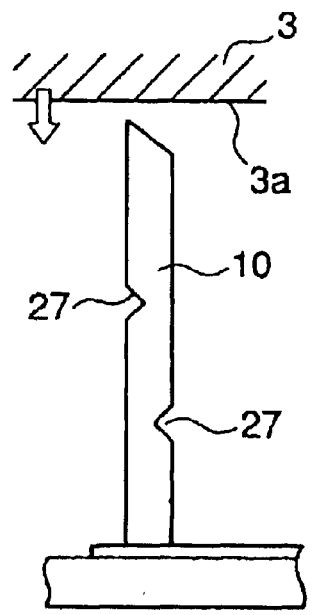
FIG. 19A and FIG. 19B are diagrams illustrating examples in which a contact electrode is bent into a particular shape by proving a notch.
Figure 19B:
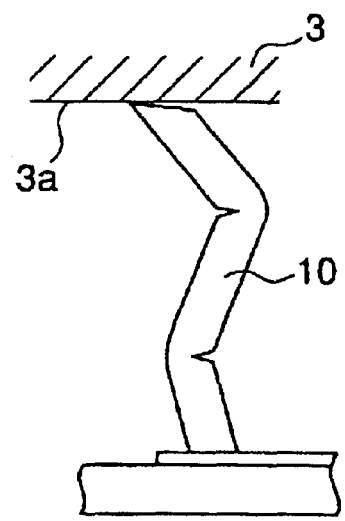

FIG. 19A and FIG. 19B show examples in which the contact electrode is bent into a given shape by providing a notch on the rod-like member. As shown in FIG. 19A, a small cut or notch 27 is made on the inner side of a portion of the rod-like member to be bent before the contact electrode 10 is bent. Then, by depressing the apex portion of the contact electrode using the depressing jig 3, the rod-like member is easily bent at the location where the cut or the notch 27 is made.

Figure 20A:
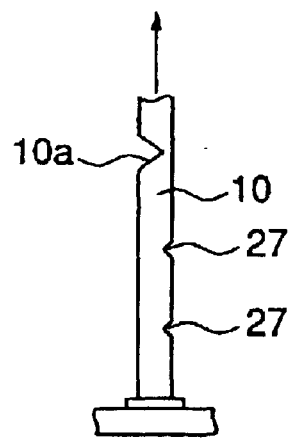
FIG. 20A through FIG. 20C are diagrams illustrating how a contact electrode bent into a particular shape by proving notches.
Figure 20B:
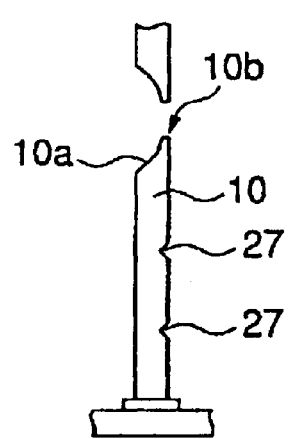
Figure 20C:
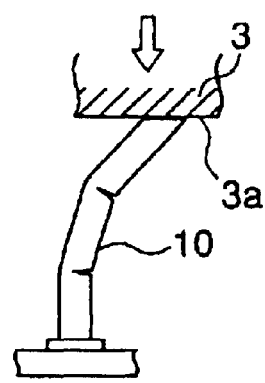

As shown in FIG. 20A, it is possible to provide the notch 27 before fracturing the rod-like member by tension. In other words, as shown in FIG. 20A, a deep notch is provided at the portion that becomes the inclined plane 10a of the apex portion and other notches 27 are made shallow. Then, as shown in FIG. 20B, the portion where the deep notch is provided is fractured by tension. Afterwards, as shown in FIG. 20C, the portions where the shallow notches are provided are bent by depressing the cutting portion of the rod-like member by the depressing jig 3. By changing the locations of the notches 27, it is possible to form the contact electrode 10 bending at any desired locations.

Figure 21A:
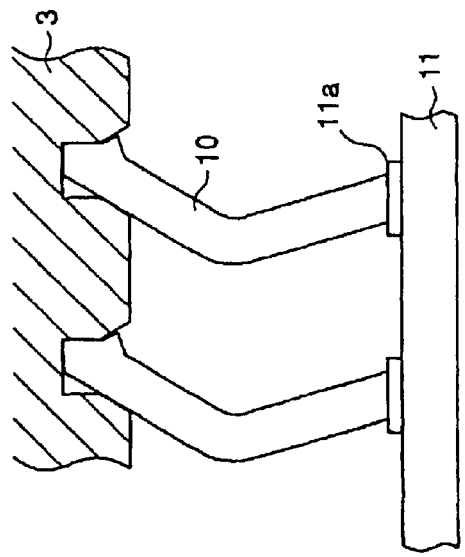
FIG. 21A and FIG. 21B are diagrams illustrating examples in which a contact electrode is bent employing a concave portion formed on a depressing jig.
Figure 21B:
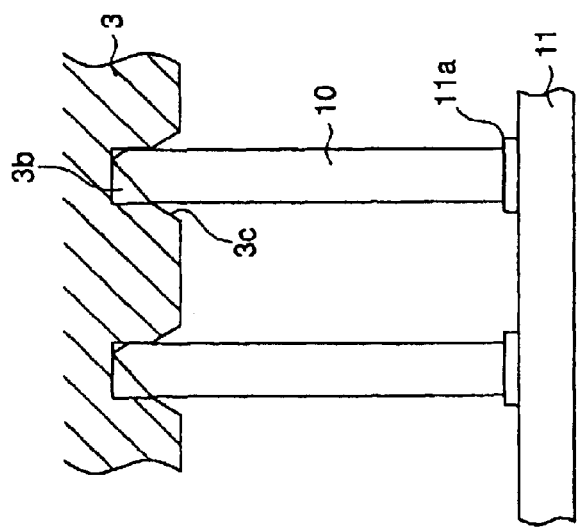

FIG. 21A and FIG. 21B show examples in which the contact electrode 10 is bent by employing a depressing jig provided with a concave portion. The depressing jig 3 is formed with the concave portion 3b into which the apex portion of the contact electrode 10 (before bending) is fit. An inclined plane 3c is provided at an opening portion of the concave portion 3b and the contact electrode 10 bends following the inclined plane 3c. In other words, as shown in FIG. 21B, the inclined plane 3c is provided so as not to prevent the bending of the contact electrode 10 when the apex portion of the contact electrode 10 fits into the concave portion 3b. Also, by the guiding effect of the inclined plane 3c, the apex portion of each contact electrode 10 can easily fit into the concave portion 3b. Additionally, by limiting the position of the apex portion of the contact electrode 10 through the use of concave portion 3b, the apex portion of the contact electrode 10 can be positioned with high accuracy.

It is noted that the apex portions of the contact electrodes 10 shown in FIG. 21B are deformed in conformity to the shape of the concave portion 3b. By doing so, the shape of the apex portion of the contact electrode 10 can be reformed in to a uniform shape.

Figure 22:
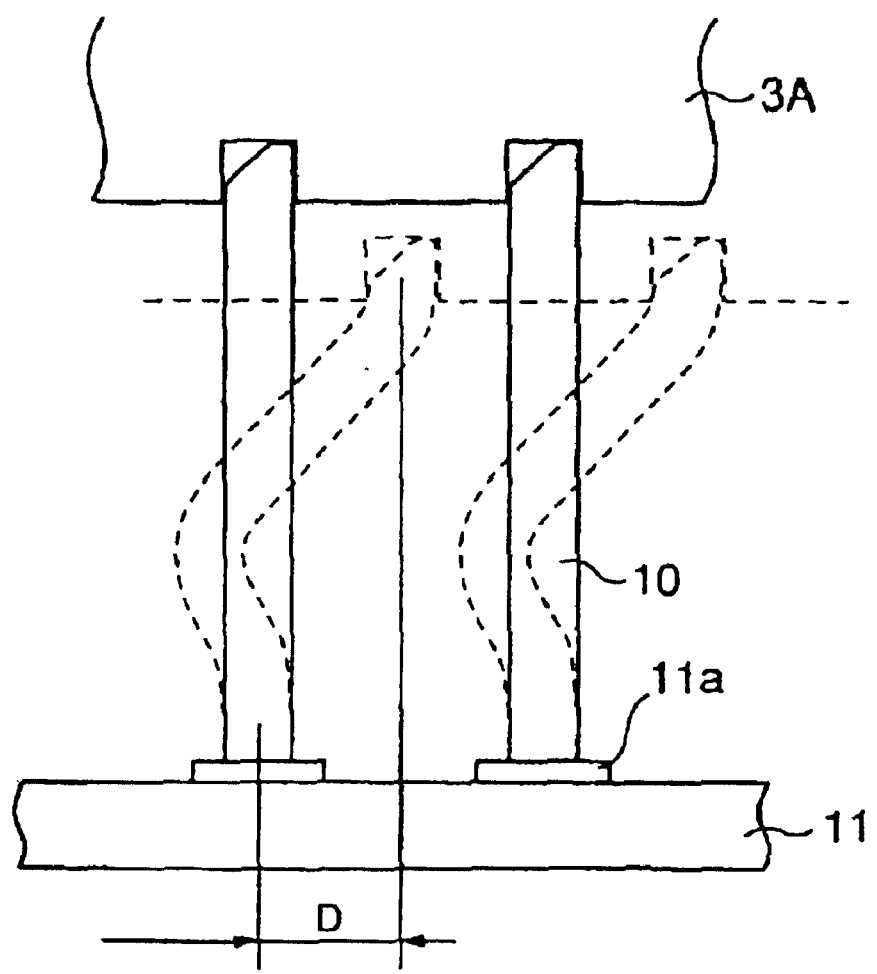
FIG. 22 is a diagram illustrating an example in which a contact electrode is bent by moving a depressing jig in horizontal and vertical directions.

Also, as shown in FIG. 22, by displacing the depressing jig 3 not only in the perpendicular (vertical) direction but also in the horizontal direction by an offset distance D, it is possible to change the relative positions in the horizontal direction of the root portion and the apex portion of the contact electrode.

If the positions in the horizontal direction of the root portion and the apex portion of the contact electrode 10 differ, when the apex portion of the contact electrode 10 contacting the subject to be contacted (the electrode of the semiconductor device) is depressed, the contacting portion moves along an oscillating path and thus achieving a wiping motion. In other words, the contact electrode 10 is displaced with its apex portion making contact with the subject to be contacted. By doing so, it is possible to obtain a good contact. Also, by displacing the depressing jig 3A in the horizontal direction, it is possible to bend the contact electrode 10 in a desired direction even more accurately.

Figure 23:
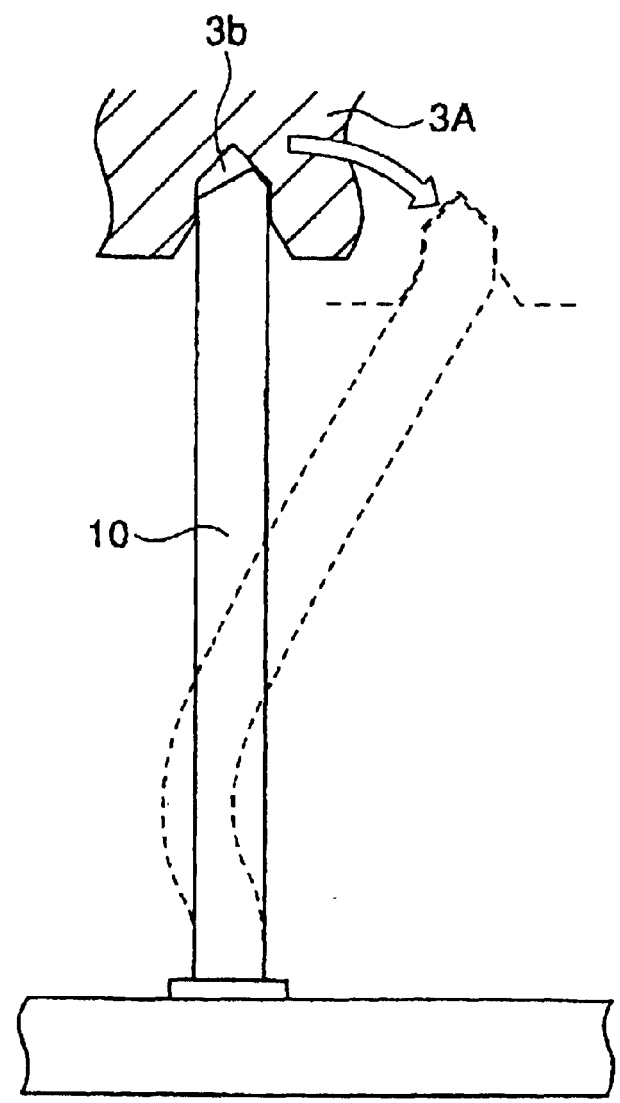
FIG. 23 is a diagram illustrating an example in which the apex portion of a contact electrode is reformed in conformity with the shape of a concave portion of a depressing jig.

FIG. 23 shows an example in which the apex portion of the contact electrode 10 is reformed in conformity to the shape of the concave portion 3b as in FIG. 21B. In the example shown in FIG. 23, before bending, the apex portion of the contact electrode 10 (rod-like member) is off-centered and leaning against one side of the concave portion. After bending, the apex portion of the contact electrode 10 is reformed to the shape having its apex located at the center.

Figure 24A:
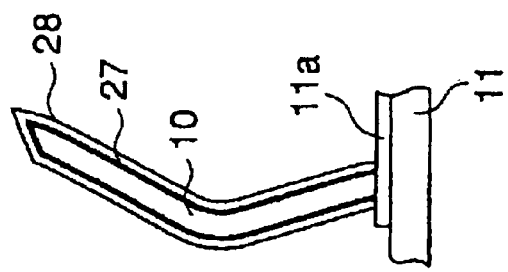
FIG. 24A through FIG. 24D are diagrams illustrating the process of applying a coating for reinforcing a rod-like member.
Figure 24B:
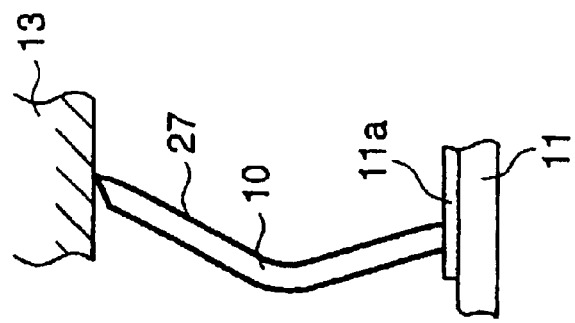
Figure 24C:
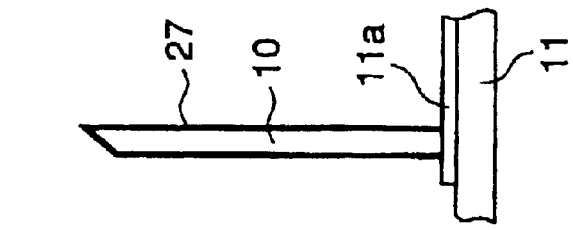
Figure 24D:
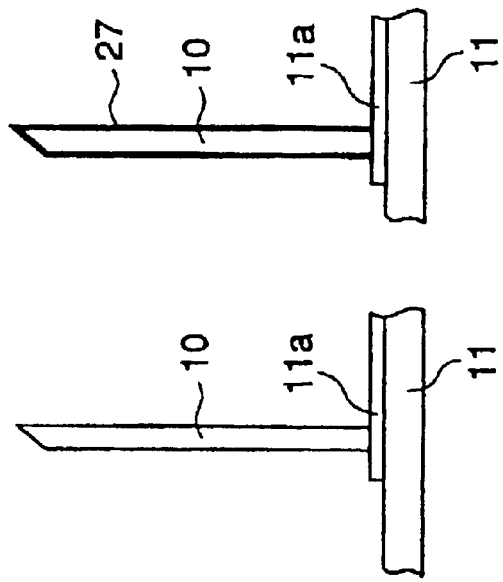

FIG. 24A through FIG. 24D show diagrams illustrating the process of applying a coating for reinforcing the rod-like member. As shown in FIG. 24A, the rod-like member is joined on the substrate so as to form the contact electrode 10 before bending. Then, as shown in FIG. 24B, a reinforcing coating 27 is applied to the contact electrode before bending. The reinforcing coating 27 has a thickness (or strength) so as not to inhibit the bending/deformation of the contact electrode. Then, as shown in FIG. 24C, the contact electrode is bent using the depressing jig 3. After completion of the bending of the contact electrode 10, a further reinforcing coating 28 is applied to the contact electrode in order to fulfill the requirements as a contact electrode.

The further reinforcing coating 28 is a coating made of conductive material such as a metal plating layer. By applying the further reinforcing coating 28, the strength of the contact electrode 10 may be increased and a spring constant may be varied. Also, the further reinforcing coating 28 may have functions of improving the corrosion resistance and of increasing the contactability to the subject to be contacted.

Figure 25A:
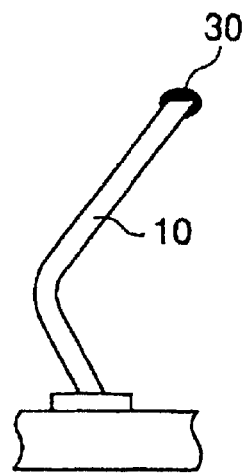
FIG. 25A and FIG. 25B are diagrams illustrating examples in which the apex portion of a contact electrode is processed.
Figure 25B:
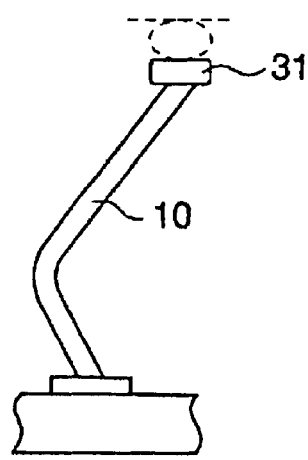

FIG. 25A and FIG. 25B show examples in which the apex portion of the contact electrode 10 is processed. FIG. 25A shows the example in which a tipping member 30 with good contactability with the subject to be contacted is provided at the apex portion of the contact electrode 10. For example, if the material of the subject to be contacted (LSI terminal) is solder and the rod-like member is made of gold, an alloy of solder and gold (AuSn) may be formed. Such alloy may contaminate the probe and adhere to the solder of the LSI and thus lead to problems such as a decrease in the solderability, etc. In view of the above, when the contact electrode 10 is to contact the solder, for example, at least the apex portion of the probe may be plated/adhered to with platinum-based metals such as rhodium, palladium, and platinum, which have less probability of forming an alloy with Sn, so as to prevent the alloying.

FIG. 25B shows the example in which a tipping member 31 is provided at the apex portion of the contact electrode 10, wherein the tipping member 31 has a shape that can obtain good contactability with the subject to be contacted such as a protruded electrode by conforming to the shape of the subject to be contacted. For example, if the subject to be contacted is a solder bump, it is better to receive the solder bump with a wider flat surface. In such a case, as shown in FIG. 25B, a plate member of a platinum-based metal may be attached afterwards.

Figure 26A:
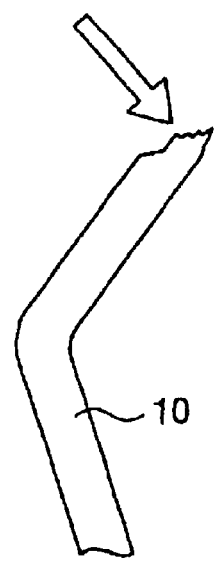
FIG. 26A and FIG. 26B are diagrams illustrating examples in which a laser beam is irradiated so as to deform the apex portion of a contact electrode so as to adapt the apex for contact.
Figure 26B:
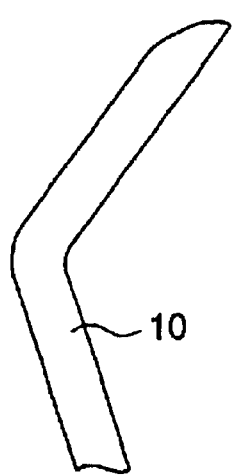

FIG. 26A and FIG. 26B show examples in which the apex portion of the contact electrode 10 is laser beam machined into a shape adapted for better contact. In other words, by irradiating the laser beam to the apex portion of the contact electrode 10 (see FIG. 26A) after bending the contact electrode 10, the apex portion is melted, the shape of the apex portion is adjusted (see FIG. 26B), and properties such as a degree of hardness, etc. are improved. Thus, the inclined plane 10a of the apex portion of the contact electrode 10 is intended exclusively for the simultaneous bending of the plurality of the contact electrodes and after the bending the apex portion may be modified to a suitable material and shape for the subject to be contacted. It is also possible to employ a blasting process, etc., so as to partially cure the surface of the contact electrode.

Figure 27A:
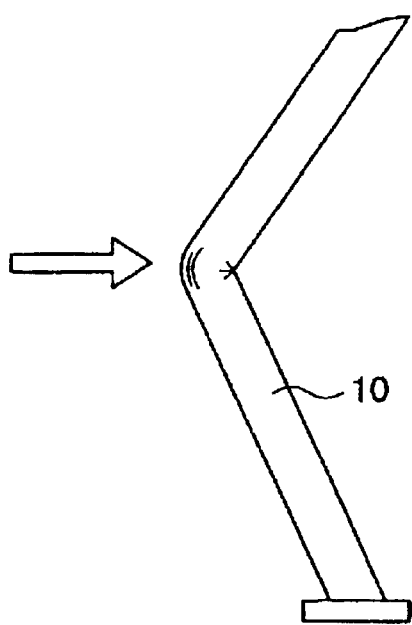
FIG. 27A and FIG. 27B are diagrams illustrating examples in which a laser beam is irradiated so as to deform a bending portion of a contact electrode.
Figure 27B:
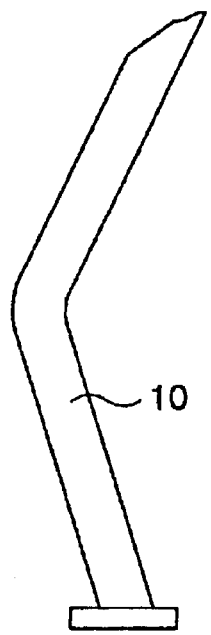

Also, depending on the angle and the position of the laser irradiation, the irradiated subject is partially remelted and thus the dimensions of the apex portion after the curing differ from those before the laser irradiation. To take advantage of this dimension variation, the laser beam may be irradiated to a part of the contact electrode so as to deform the relevant part and perform the position correction of the apex portion. In other words, as shown in FIG. 27A, when the laser beam is irradiated only to the bending portion of the contact electrode 10, the bending angle of the bending portion changes and thus the apex portion may be appropriately positioned as shown in FIG. 27B.

The following is a description of a second embodiment according to the present invention.

FIG. 28 is a perspective view of the second embodiment according to the present invention. The contactor according to the present invention is employed in the testing of an area array type semiconductor device with a plurality of electrodes arranged at narrow pitches. Thus, the plurality of contact electrodes 40 is arranged in a form of a matrix on a contactor substrate 41. The contact electrode 40 in the second embodiment according to the present invention is formed employing a wire bonding technique.

In other words, a cut is made to the wire before bonding, then by wire-bonding the wire to the contactor substrate (wiring substrate) and by pulling, a tensile fracture is generated at the cutting portion. Afterwards, by depressing an inclined plane of the cutting portion remaining at the apex portion of the wire, the wire can be easily bent in conformity to the angle of the inclined plane.

The example in which the cut is made in the bonding wire and the cut terminals are used for the LSI package is disclosed in Japanese Laid-Open Patent Application number 2001-118876. This patent describes the usage of the cut wire as the LSI packages but it does not disclose the features of the probe (contact electrode) as in the present invention. The present invention relates to the functions necessary as a contactor such as the shape of the cutting plane, the bending performed making use of the shape of the cutting plane, the intended provision of the wiping motion, etc., and thus the object and the features of the present invention differ from that of the mentioned application.

Japanese Laid-Open Patent Application number 9-505439 discloses a technology of cutting the tip of the wire needle formed by the wire bonding. However, this technique is characterized in that the wire is bent after being joined to the substrate and after which the apex portion of the needle is formed by cutting the wire with a cutting mechanism. In this method, there are disadvantages such as A) each wire has to be bent separately and B) the method cannot accommodate narrow pitches, etc. Also, depending on the bending loop path, the bonding head (capillary) is likely to interfere with neighboring pins. Further, since the location of the wire cutting is a connecting position (final needle point position) to the substrate, the cutting mechanism inevitably interferes with the neighboring pins already formed.

As mentioned above, according to the present invention, the plurality of needles can be easily and simultaneously bent because of the inclined plane at the apex portion and the provision of cuts in the needle. Also, by providing the cuts before the wire connection, the plurality of the contact electrodes arranged at narrow pitches can be formed. In this matter, the present invention differs greatly from the technique mentioned in the above-mentioned application.

Figure 29D:
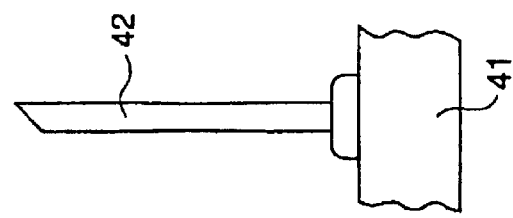
FIG. 29A through FIG. 29D are diagrams illustrating the process of forming the contact electrodes shown in FIG. 28.
Figure 29C:
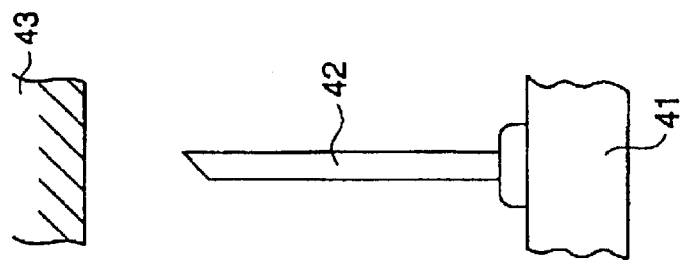
Figure 29B:
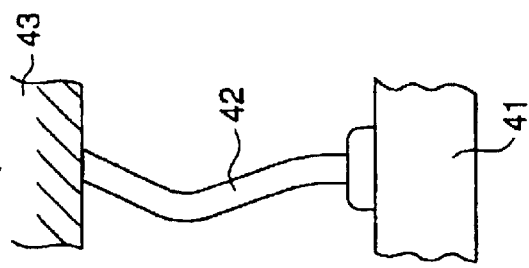
Figure 29A:
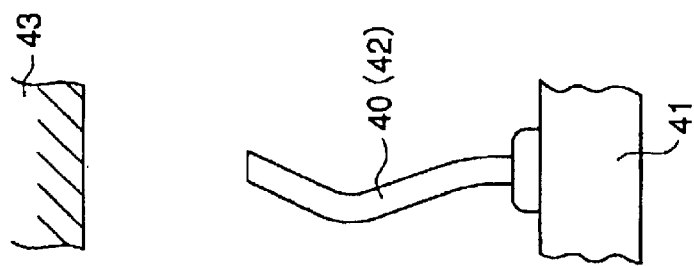

FIG. 29A through FIG. 29D are diagrams illustrating the process of forming the contact electrode 40. As shown in FIG. 29A, a cylindrical metal wire 42 is joined to the contactor substrate 41 and is vertically uprising on the contactor substrate 41. This process is performed by applying a standard wire bonding technique as shown in FIG. 30A through FIG. 30D. The metal wire 42 may be made of any gold or gold alloy normally used in the standard wire bonding technique. The metal wire 42 may be formed of a platinum-based metal such as palladium, platinum, and rhodium or an alloy including the mentioned metals in major proportion. The metal wire 42 is usually joined on the electrode pad formed on the contactor substrate 41 but the diagrammatical representation of the electrode pad is omitted.

Then, as shown in FIG. 29B, the depressing jig 43 is lowered towards the apex portion of the metal wire 42 and as shown in FIG. 29C, the metal wire 42 is buckled and thus bent. Finally, as shown in FIG. 29D, the bent contact electrode 40 is formed.

Figure 30D:
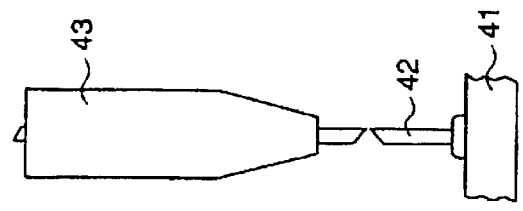
FIG. 30A through FIG. 30D are diagrams illustrating the process of joining a metal wire to a contactor substrate.
Figure 30C:
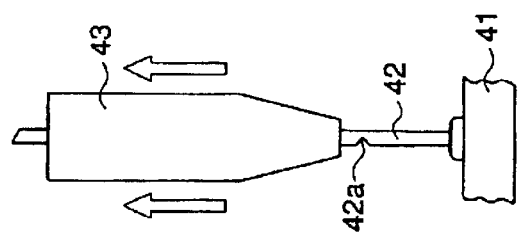
Figure 30B:
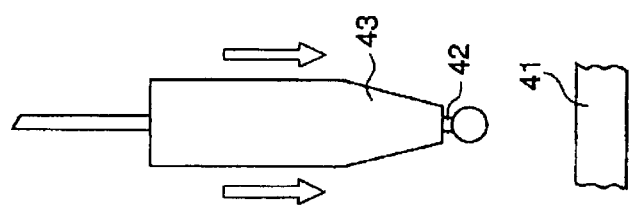
Figure 30A:
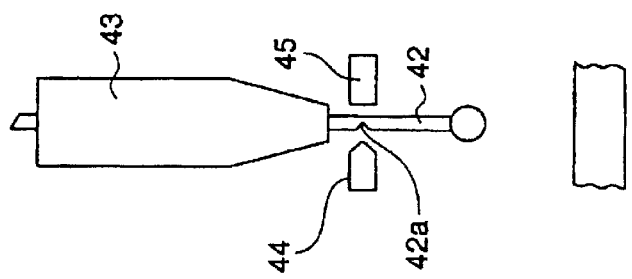

FIG. 30A through FIG. 30D are diagrams illustrating the process of joining the metal wire 42 to the contactor substrate. First, as shown in FIG. 30A, a predetermined length of the metal wire 42 is reeled out of the capillary 43 of the wire bonding device and a cut 42a is formed at a location at a predetermined distance from the tip of the metal wire 42 by pressing a cutting tool (cutter) 44 against the relevant location. At this time, a receiving jig 45 may be provided at the opposite side of the cutting tool 44 so as to avoid the deformation of the metal wire 42. A ball is formed at the tip of the metal wire.

Then, as shown in FIG. 30B, the capillary 43 is lowered so as to join the ball of the metal wire 42 to the electrode pad (not shown) of the contactor substrate 41. Then as shown in FIG. 30C, the capillary 43 is raised and displaced above the cut 42a. As shown in FIG. 30D, by pulling the metal wire 42 by the capillary 43, the metal wire 42 is cut (fractured) at the notch 42. By doing so, the metal wire 42 having an inclined plane formed by the cut 42a by the cutting tool 44 and the fracture surface is joined to the electrode pad of the contactor substrate 41.

FIG. 31A and FIG. 31B are diagrams of the metal wire 42 formed by the above-mentioned process, wherein FIG. 31A shows a side elevation and FIG. 31B shows an enlarged diagram of the apex portion of the metal wire 42. As shown in FIG. 31B, the apex portion of the metal wire 42 formed by the process shown in FIG. 30A through FIG. 30D comprises the inclined plane 42b formed by the cut 42a by the cutting tool 44 and the fracture surface 42c formed by pulling the metal wire in the upward direction.

Figure 32A:
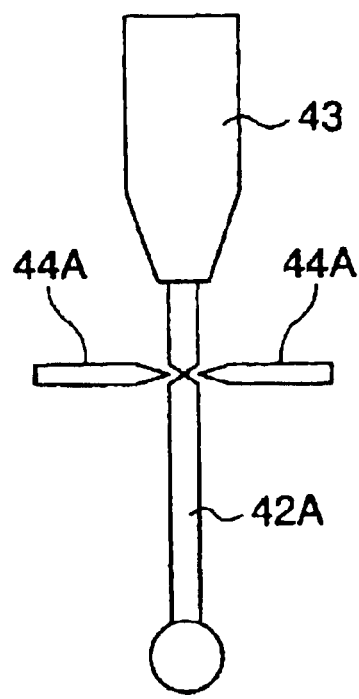
FIG. 32A and FIG. 32B are diagrams illustrating a configuration in which a cut is made from both sides of the metal wire.
Figure 32B:
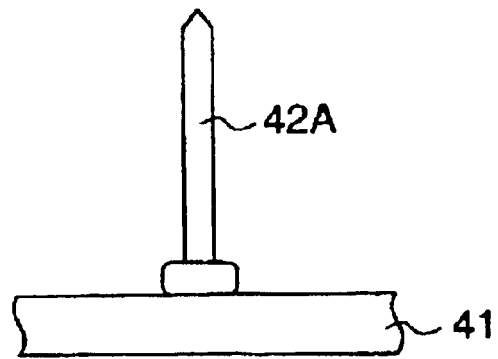

According to the present invention, the metal wire 42 is configured to have the fracture surface 42c, however, as shown in FIG. 32A and FIG. 32B, it is possible to form a plurality of cuts from both sides of the metal wire by the cutting tool 44A. This necessitates a special configuration so as to determine the direction of buckling of the metal wire 42A, which is described in detail hereinafter.

FIG. 33A through FIG. 33D are diagrams describing the process of forming a plurality of metal wires 42 on the contactor substrate 41. As shown in FIG. 33A, the cut 42a is made by the cutting tool 44 to the metal wire 42 before joining to the contactor substrate 41 (to the electrode pad not shown). Then, as shown in FIG. 33B, the metal wire is joined to the wiring substrate one by one and, as shown in FIG. 33C, the portion above the cut 42a is pulled by the capillary 43. Finally, as shown in FIG. 33D, the metal wire 42 is formed by fracturing. Thus the plurality of the metal wires is aligned to one another on the contactor substrate 41.

Figure 34A:
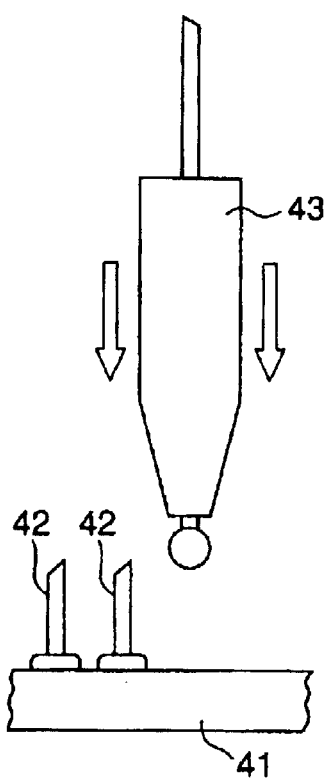
FIG. 34A and FIG. 34B are diagrams illustrating the interference problem encountered when trying to cut to a metal wire after the metal wires are joined to a contactor substrate.
Figure 34B:
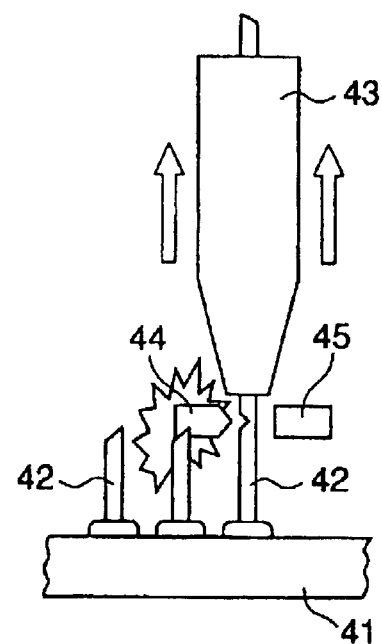

When forming the plurality of the metal wires 42 on the contactor substrate 41 as shown in FIG. 34A and forming the cut 42a by the cutting tool 44 after each metal wire is joined to the contactor substrate 41, the cutting tool 44 may interfere the metal wires 42 previously formed as shown in FIG. 34B. This becomes a serious problem when arranging the metal wires 42 at narrow pitches. However, by forming the cut 42a before joining the metal wire 42 to the substrate 41 in accordance with the present embodiment, it is not necessary to bring the cutting tool close to the metal wires previously formed and thus the plurality of metal wires can be arranged at narrow pitches without the problem mentioned above.

Figure 35A:
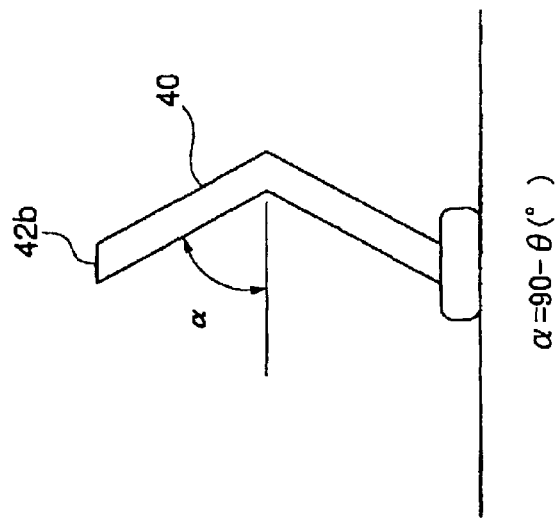
FIG. 35A and FIG. 35B are diagrams illustrating the bending of a metal wire.
Figure 35B:
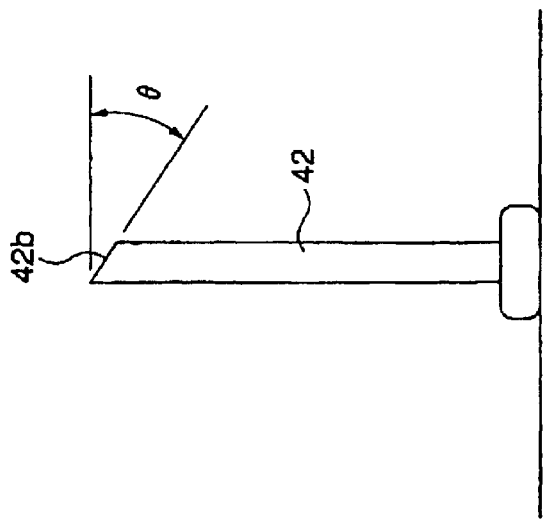

FIG. 35A and FIG. 35B are diagrams illustrating the bending of the metal wire 42 formed as mentioned above. The angle of the inclined plane 42b formed by the cut by the cutting tool 44 is set to theta as shown in FIG. 35A. The metal wire 42 is deformed by the buckling so as to have a buckling angle of alpha. At this time, in order to bend the metal wire 42 so as to have the inclined plane 42b of the apex portion horizontal, the buckling angle alpha is set to (90—theta).

The following is a description of modifications of the contact electrode 40 according to the present embodiment with reference to the drawings. It is noted that the detailed description of the following modifications may be omitted where it is similar to that of modifications of the first embodiment according to the present invention.

Figure 36:
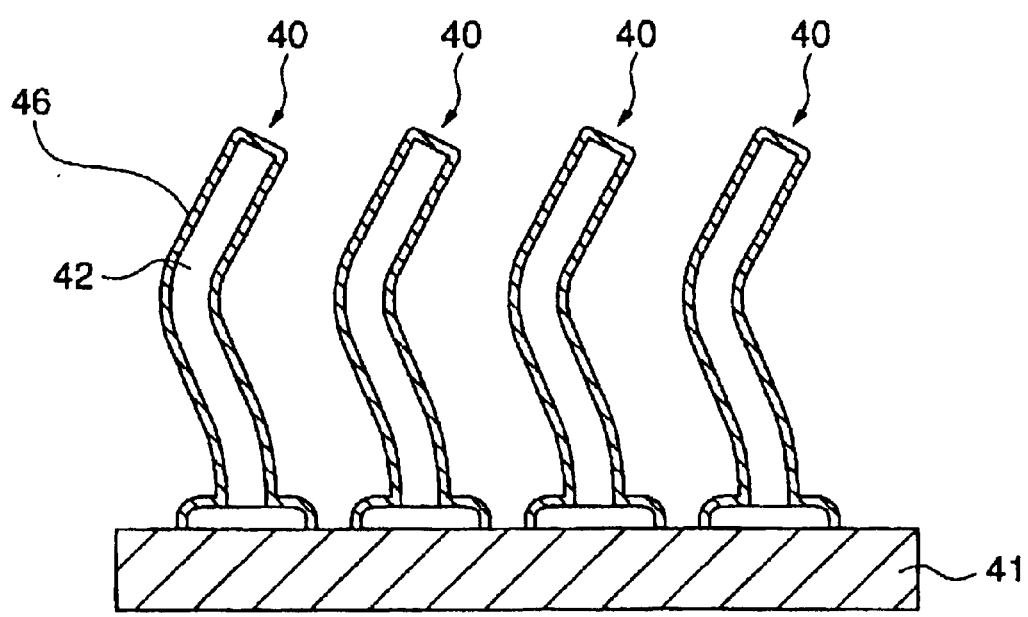
FIG. 36 is a diagram showing contact electrodes having their surfaces covered with a conductive coating.

FIG. 36 shows a plurality of contact electrodes 40, the surfaces of which are covered by a conductive coating 46. In other words, the conductive coating 46 is applied to the surface of the metal wire 42 by plating or coating. By applying the conductive coating 46 to the surface of the metal wire 42, it is possible to modify the strength or the resilience of the metal wire 42 and improve the contact characteristic with respect to the subject to be contacted.

Figure 37:
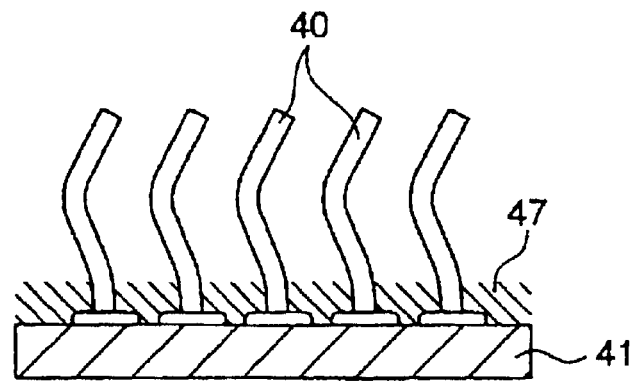
FIG. 37 is a diagram illustrating an example in which a surface protective layer is provided on the contactor substrate so as to protect and reinforce the joining portion of a contact electrode.

FIG. 37 shows a diagram in which a surface protective layer 47 is provided on the contactor substrate 41 so as to protect and strengthen the joining portion (the root portion) of the contact electrode. The surface protective layer 47 is formed by coating or surface treatment.

Figure 38:
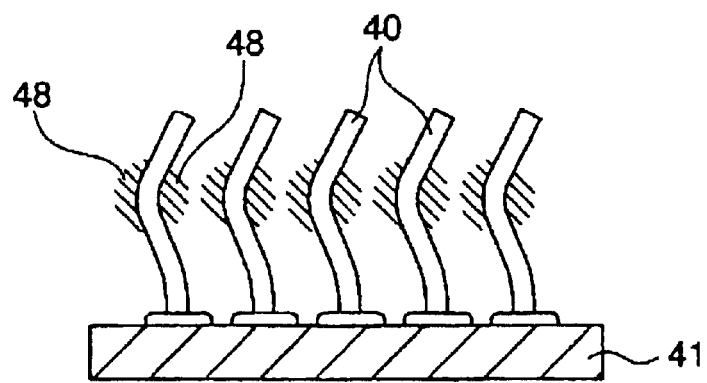
FIG. 38 is a diagram illustrating an example in which a protrusion is provided on each contact electrode.

FIG. 38 shows an example in which a protrusion portion 48 is provided to each contact electrode 40. The protrusion portion 48 is made of an insulating material and prevents a short circuit due to the neighboring contact electrodes contacting one another. The protrusion portion 48 may be provided on one side of every contact electrode or may be provided on both sides of every other contact electrode.

Figure 39A:
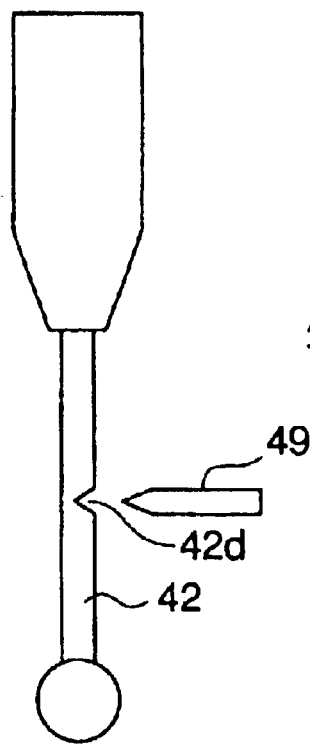
FIG. 39A through FIG. 39C are diagrams illustrating the process of buckling with provision of a smaller cut 42d in the metal wire.
Figure 39B:
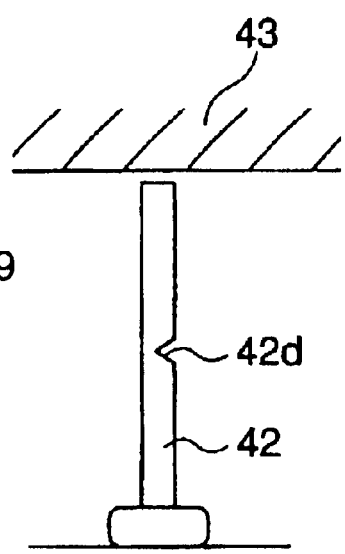
Figure 39C:
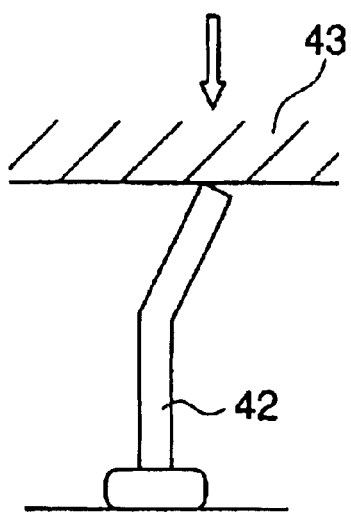

FIG. 39A through FIG. 39C show diagrams illustrating the process of buckling the metal wire 42 at a position of a small cut 42d by forming the small cut 42d in advance on the metal wire 42. In other words, as shown in FIG. 39A, the small cut 42d is formed in advance on the metal wire 42 by the cutting tool 49. Then, as shown in FIG. 39B, the apex portion of the metal wire 42 is depressed by the depressing jig 43. Then the metal wire 42 deforms and buckles at the position of the small cut 42d with the cut 42d located inward of the bending.

FIG. 40A through FIG. 40C show an example in which two cuts 42d are provided in the process mentioned in FIG. 39A through FIG. 39C. In this case, the metal wire 42 is buckled at two positions enabling the formation of the contact electrode 40 with a more complex bending shape. It is noted that the number of the cuts 42d is not limited to one or two but may be any number so as to bend the contact electrode 40 into the desired shape.

Figure 41:
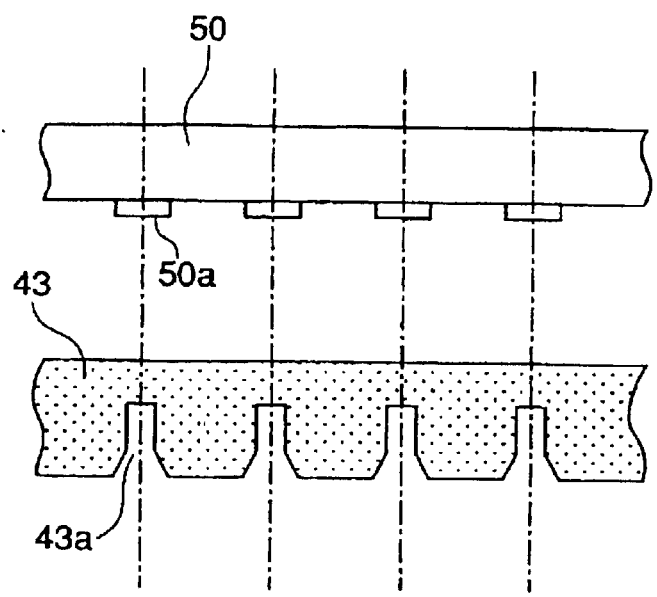
FIG. 41 is a diagram illustrating an example in which a concave portion is provided on a depressing jig.
Figure 42:
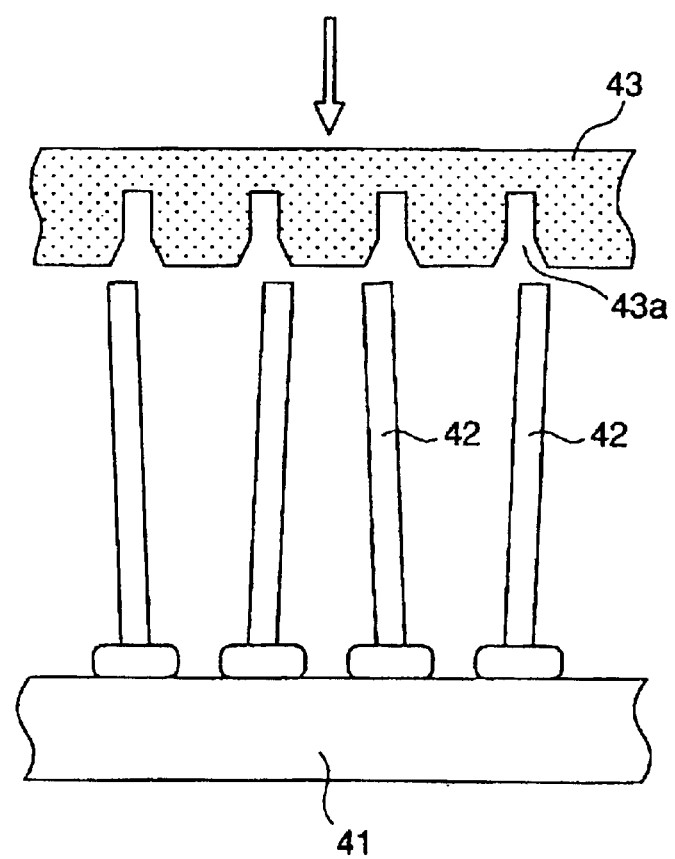
FIG. 42 is a diagram illustrating the start of a bending process of a metal wire by a depressing jig having a concave portion.
Figure 43:
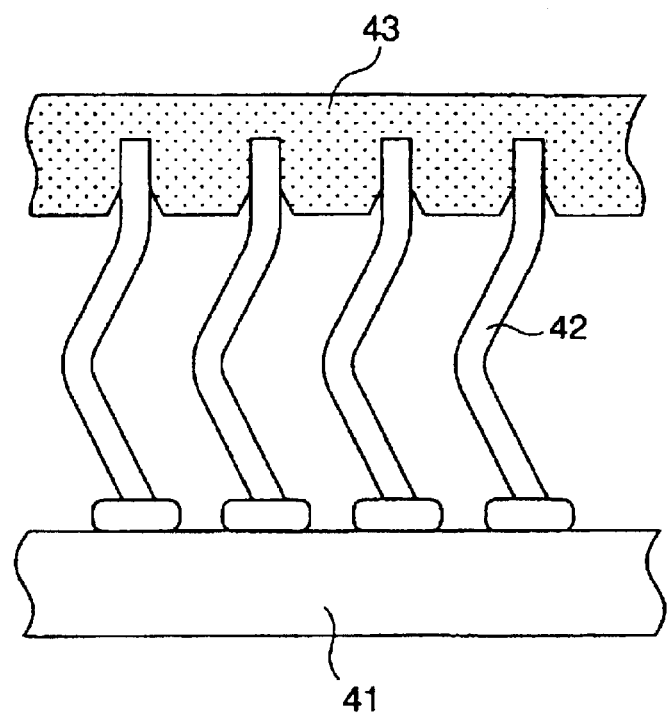
FIG. 43 is a diagram illustrating a bending process of a metal wire by a depressing jig having a concave portion.
Figure 44:
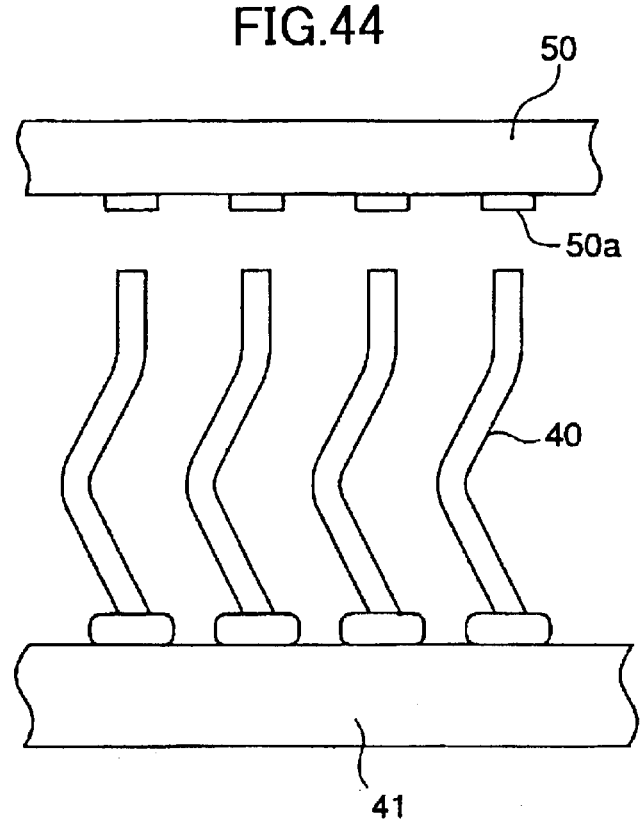
FIG. 44 is a diagram illustrating the result of a bending process of a metal wire by a depressing jig having a concave portion.

FIG. 41 shows an example in which a concave portion 43a is provided on the depressing jig 43. The concave portions 43a are provided in correspondence with the positions of the terminals of the subject to be tested (semiconductor device) 50. An inclined plane is provided at the opening portion of the concave portion 43a in order to facilitate the insertion of the apex portion of the metal wire 42 into the concave portion 43a. Thus, even when there is variation in the apex positions of the metal wires 42 at the time of depressing, the apex of each metal wire 42 enters into the corresponding concave portion 43 as shown in FIG. 42. Then, the metal wire 42 is depressed by the depressing jig 43 and is bent as shown in FIG. 43. The contact electrodes 40 formed as mentioned above can be precisely registered with the corresponding electrodes 50a of the subject to be tested (the semiconductor device) 50, as shown in FIG. 44.

FIG. 45A through FIG. 45C show examples in which the apex portion of the contact electrode performs an oscillating movement. As shown in FIG. 45A, the horizontal position of the apex portion of the contact electrode 40A deviates from the horizontal position of the joining portion (the root portion) of the contact electrode 40A by an offset distance D. When a depressing force (contact force) is applied to the apex portion of the contact electrode 40A formed into the shape as mentioned above as shown in FIG. 45B, the apex portion performs the oscillating movement as shown in FIG. 45C. The oscillating movement serves, for example, to break the natural oxide film formed on the surface of the subject to be contacted and to achieve a good contact with the material to be contacted.

Figure 46B:
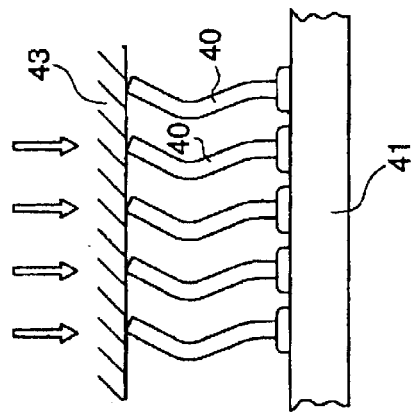
FIG. 46A through FIG. 46C are diagrams illustrating examples in which the heights of contact electrodes vary.
Figure 46A:
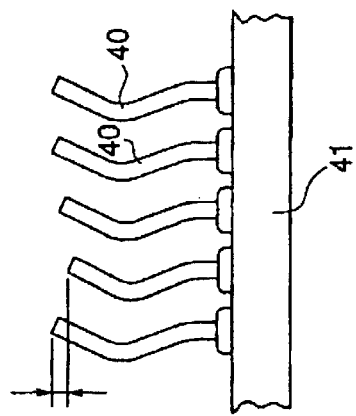
Figure 46C:
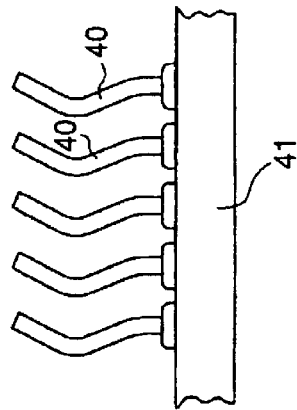

FIG. 46A through FIG. 46C are examples illustrating the case in which the heights of the contact electrodes vary. Even when the heights of the contact electrodes vary as shown in FIG. 46A, the variation may be adjusted by depressing the depressing jig 43 as shown in FIG. 46B, and the heights may be made uniform as shown in FIG. 46C.

Figure 47A:
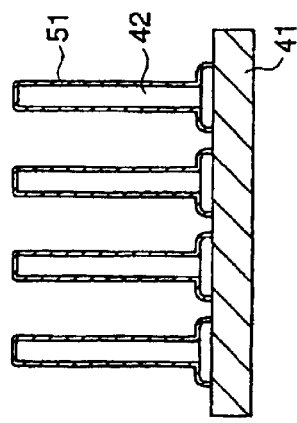
FIG. 47A through FIG. 47C are diagrams illustrating examples in which a surface treatment is applied to a contact electrode before and after the bending.
Figure 47B:
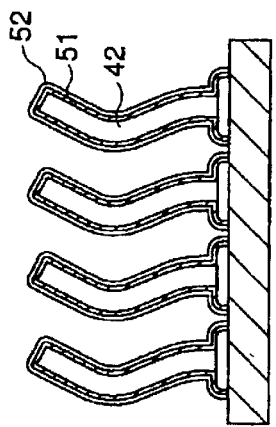
Figure 47C:
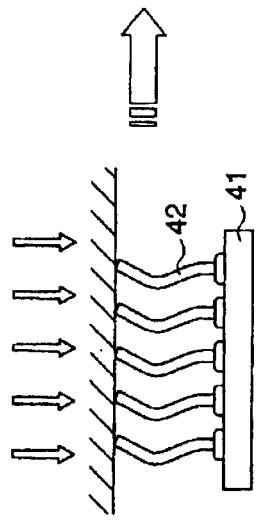

FIG. 47A through FIG. 47C show examples in which surface treatment of the contact electrode is performed before and after the bending of the contact electrode. In other words, as shown in FIG. 47A, a reinforcing coating 51 having a thickness so as not to inhibit the bending is applied to the metal wire 42 before bending and then the metal wire 42 is bent as shown in FIG. 47B. After the bending, a further reinforcing coating 52 is provided on the reinforcing coating 51 as shown in FIG. 47C so as to provide an appropriate strength and resilience as a contact electrode.

Figures 48A, 48B:
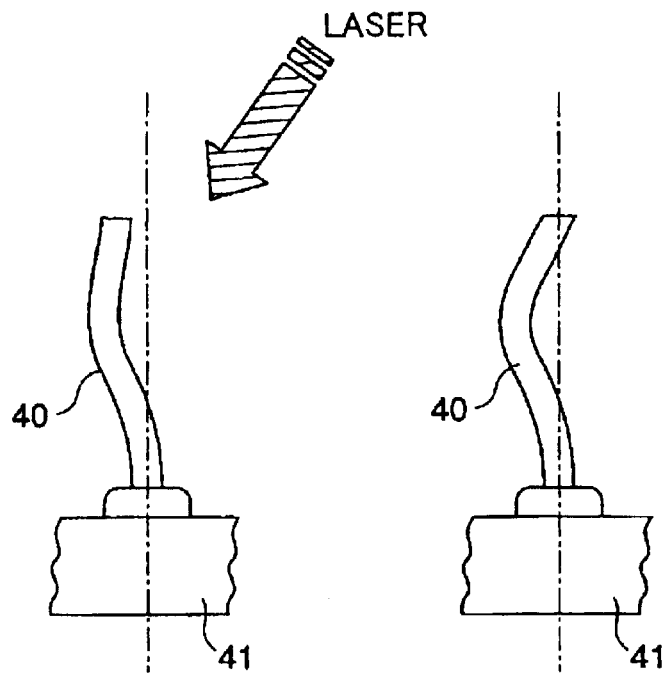
FIG. 48A and FIG. 48B are diagrams illustrating the process in which a bending angle is modified by irradiating a laser beam to a portion of a contact electrode so as to correct the position of the apex portion of the contact electrode.
Figure 49:
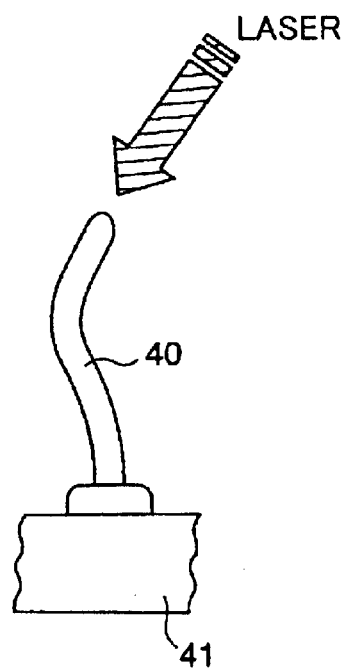
FIG. 49 is a diagram illustrating an example in which the apex portion of a contact electrode is modified by irradiating a laser beam to the apex portion of the contact electrode.
Figure 50:
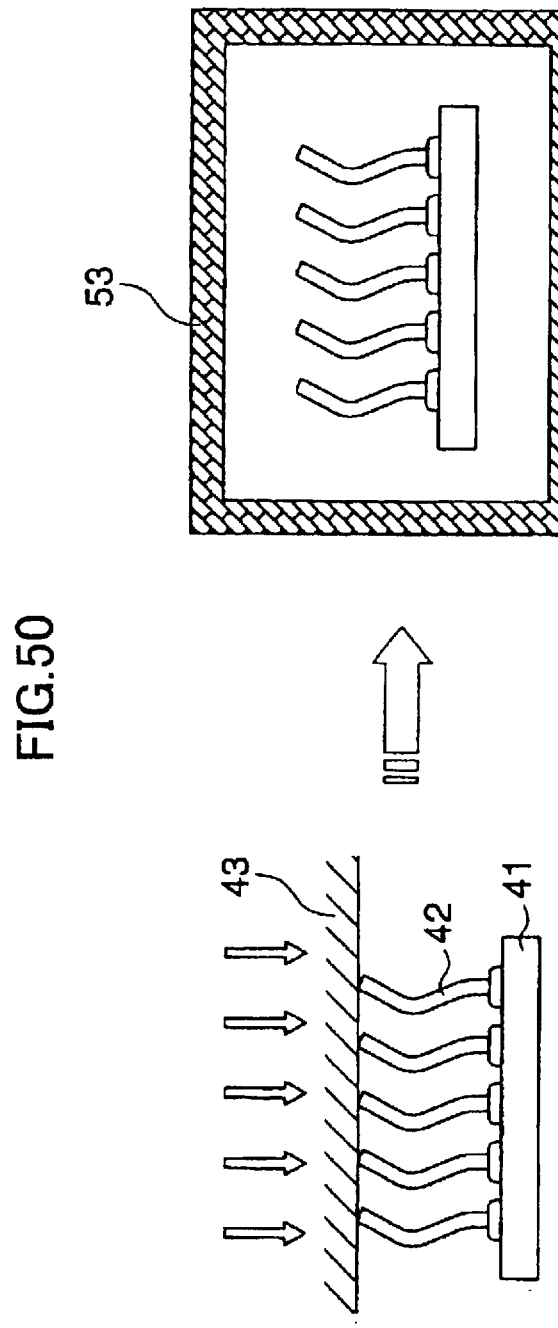
FIG. 50 is a diagram illustrating an example in which heat treatment is applied after a metal wire is bent.

FIG. 48A and FIG. 48B are diagrams illustrating the process in which the degree of bending is changed by irradiating a laser beam to a portion of the contact electrode 40. The position of the apex portion is corrected as shown in FIG. 48B. Also, FIG. 49 shows an example in which the shape of the apex portion of the contact electrode is modified by irradiating the laser beam to the apex portion of the contact electrode 40. Further, FIG. 50 shows an example in which heat treatment is performed after the bending of the metal wire 42. The bending metal wire 42 is provided in the furnace 53 for heat treatment and the residual stress, etc. generated at the time of bending is removed.

The following is a description of application of the above-mentioned embodiments with reference to the drawings.

Figure 51:
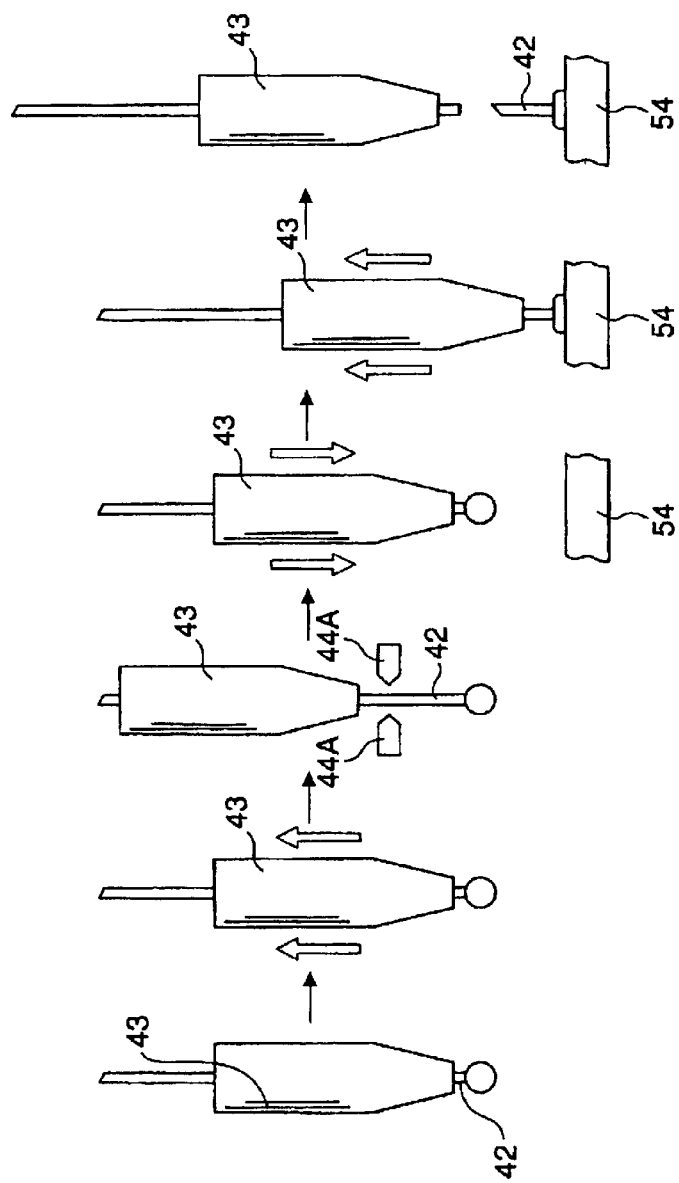
FIG. 51 is a diagram illustrating an example in which the formation of metal wires according to the present invention is applied to an electrode pad of a semiconductor device.

FIG. 51 shows a process in which the formation of metal wire according to the present invention is applied to an electrode pad of the semiconductor device. In other words, the metal wire is formed on the electrode of the semiconductor device so as to form a terminal. It is possible to easily form a terminal of the semiconductor device with a certain height.

Figure 52:
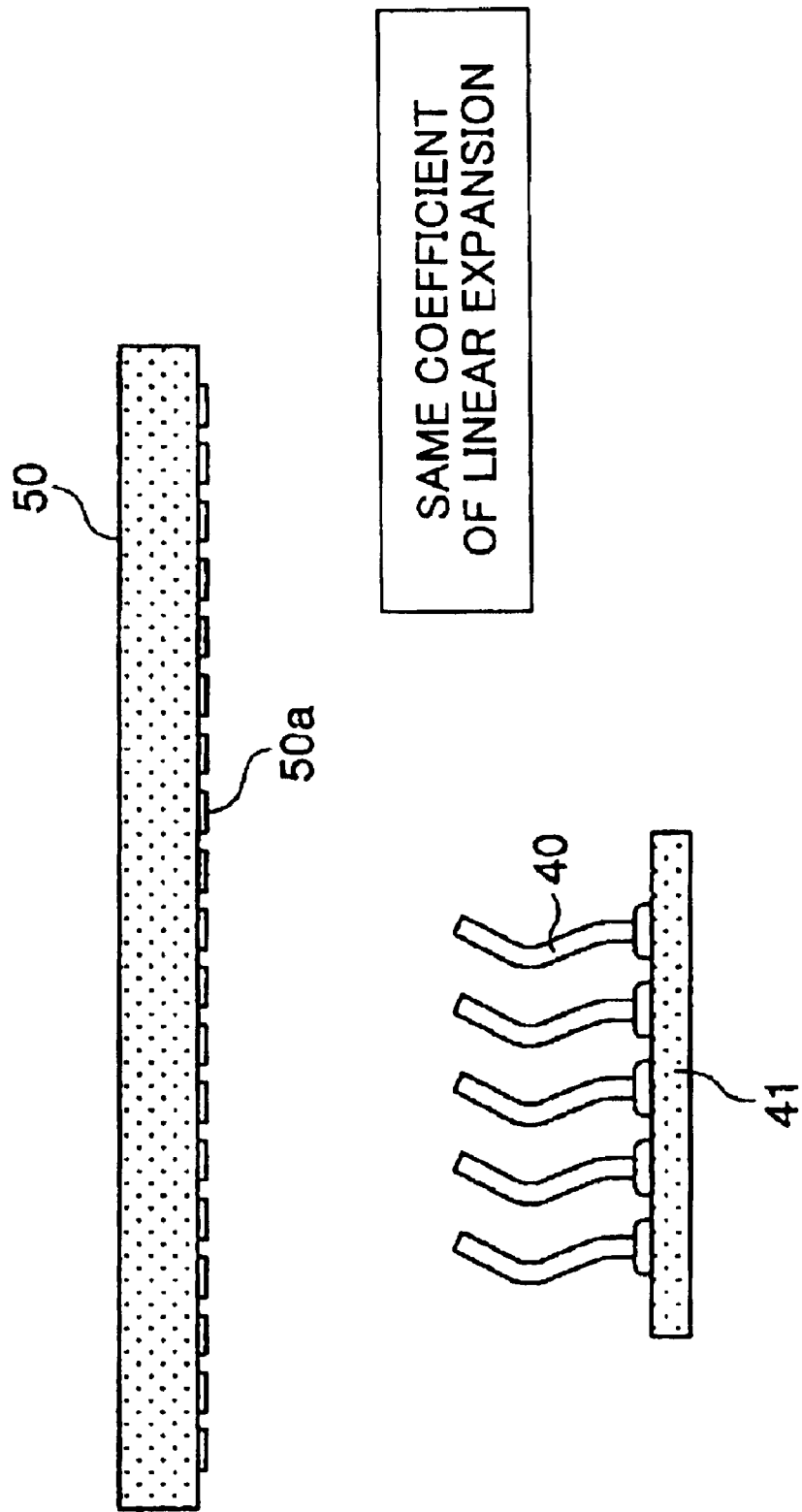
FIG. 52 is a diagram illustrating an example in which a contactor substrate is made of a material having the same coefficient of linear expansion as that of a material for a subject to be tested.

FIG. 52 shows an example in which the contactor substrate 41 is formed by the material having the same coefficient of linear expansion as that of the subject to be tested 50. By doing so, even in the case of performing the test under an overheated situation such as a burn-in test, the misalignment of the contact electrode 40 on the contactor substrate 41 and the electrode 50 of the subject to be tested can be prevented. In other words, since the contactor substrate 41 and the subject to be tested expand with the same coefficient of linear expansion, the contact electrode 40 and the electrode 50a move by the same distance.

Figure 53:
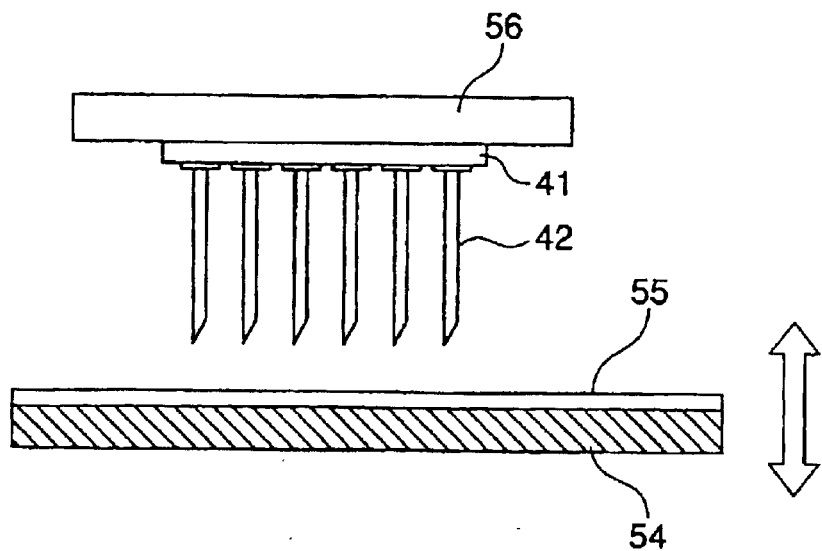
FIG. 53 is a diagram illustrating an example in which a testing device (prober) is employed for the bending of the metal wire.

FIG. 53 shows an example in which a testing device (prober) is used for bending of the metal wire. In other words, a plate 55 with a high degree of hardness is provided on a chuck top 54 of the testing device and the contactor substrate 41 is loaded to a probe card 56. By vertically moving the chuck top 54, the apex of the metal wire 42 is depressed against the chuck top 55 and thus bent. In short, a bending mechanism is formed with use of an existing testing device (prober).

Figure 54:
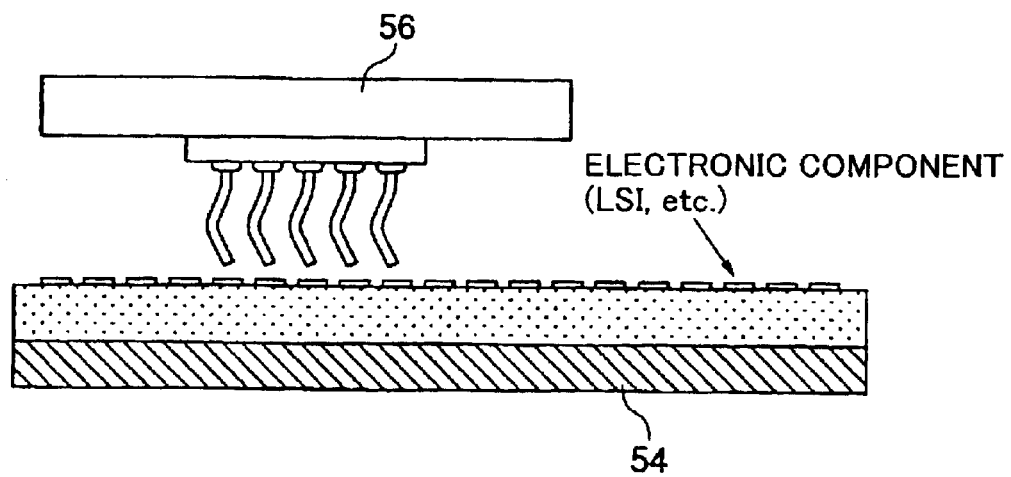
FIG. 54 is a diagram illustrating an example in which the contactor according to the present invention is employed for testing electronic components having a flat electrode such as an LSI, etc.
Figure 55:
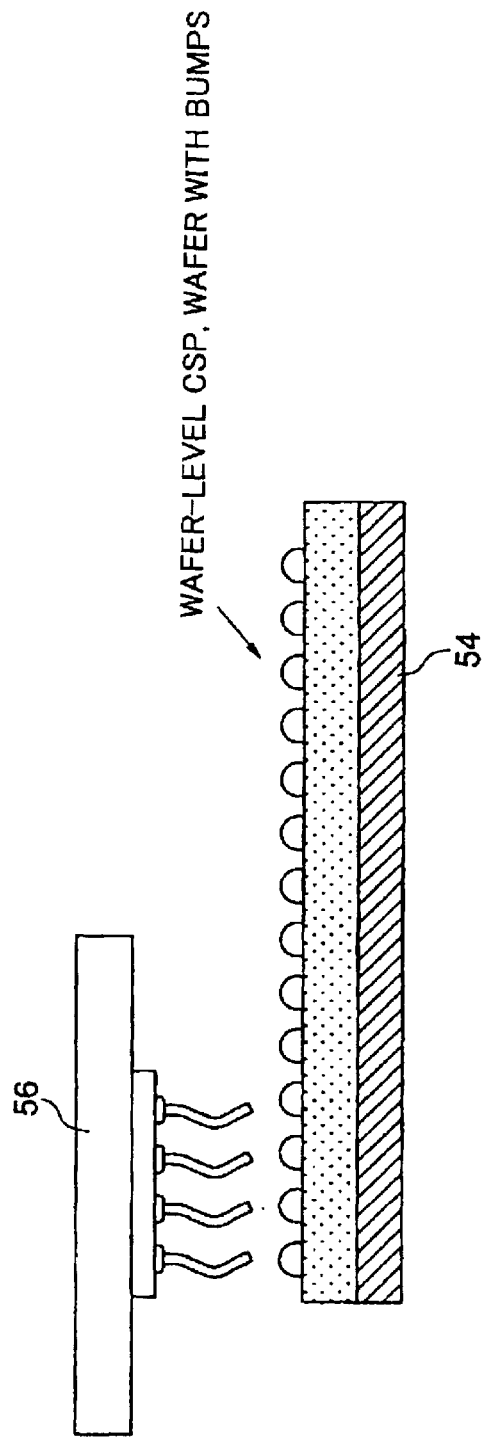
FIG. 55 is a diagram illustrating an example in which the contactor according to the present invention is employed for testing a wafer-level CSO or a wafer provided with bumps, etc.

FIG. 54 shows an example in which the contactor according to the present invention is used for testing the electronic component with flat electrodes such as an LSI, etc. Further, FIG. 55 shows an example in which the contactor according to the present invention is used for testing the wafer-level CSP, the wafer with bumps, etc.

Figure 56:
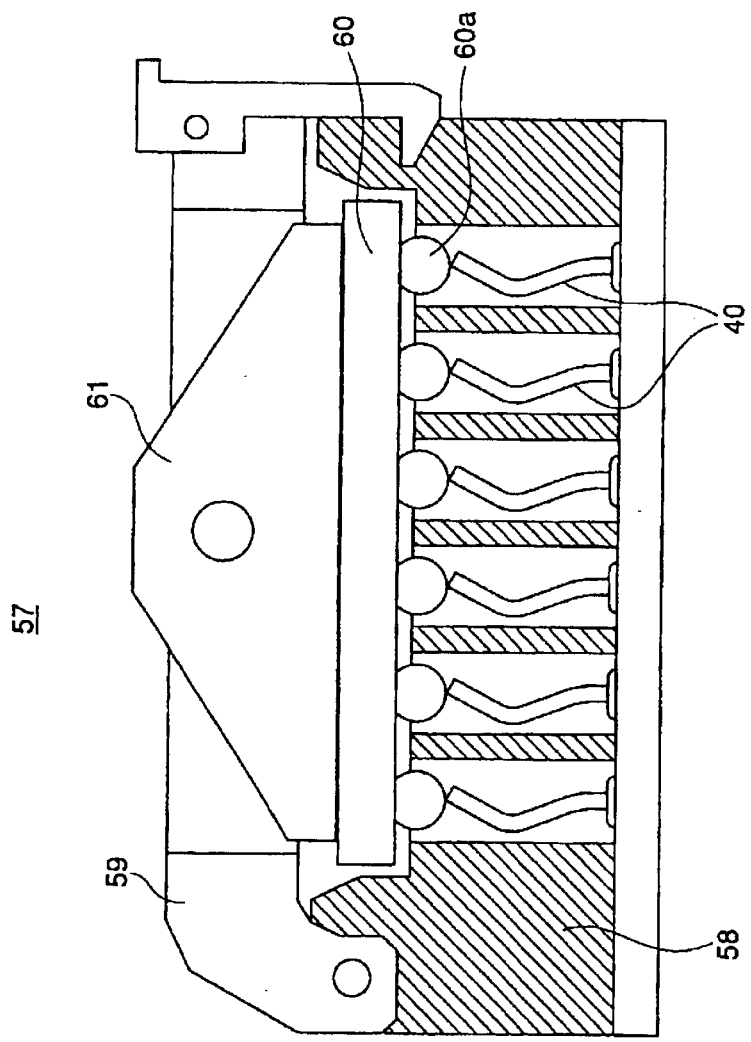
FIG. 56 is a cross section of a semiconductor device-testing socket using a contact electrode according to the present invention as a contact terminal.

FIG. 56 is a side elevation of a semiconductor device testing socket 57 using the contact electrode according to the present invention as a contact terminal. The semiconductor device testing socket 57 comprises a socket body 58 accommodating the contact electrode according to the present invention and a depressing lid 59 rotatably supported by the socket body 58. A depressing portion 61 is mounted to the depressing lid 59 so as to depress a semiconductor device 60 arranged inside the socket. When the semiconductor device 60 is depressed by the depressing portion 61, a protruding electrode 60a of the semiconductor device 60 contacts the corresponding contact electrode 40. The contact pressure is obtained from the resilience of the contact electrode 40.

The contact electrode in the mentioned embodiment is used for testing the electronic components of the semiconductor device, but since the contact electrodes can be arranged at narrow pitches, they are suitable for testing the LSI, etc., with electrodes arranged at narrow pitches. In addition, since a plurality of the contact electrodes can be formed simultaneously and since the plurality of the contact electrodes can be formed as contact electrodes with relatively small spring constants, they are suitable for testing the semiconductor devices at the wafer level.

Further, when using the contactor according to the present invention as mentioned above, it is preferable to remove the reducing substances or the organic substances attached to the contacting portion (electrode) of the subject to be tested by applying activation treatment before making contact between the contactor and the subject to be tested (electrode, etc. of the semiconductor device). Thus the wiping motion is not performed and enough electrical contact can be achieved even with small contact pressure.

By applying, for example, a coating of conductive material such as gold that is less oxidizable to the contacting portion of the subject to be contacted, the wiping motion is not performed and also enough electrical contact can be achieved with even small contact pressure. The coating of conductive material may be peeled off after the testing.

Figure 57:
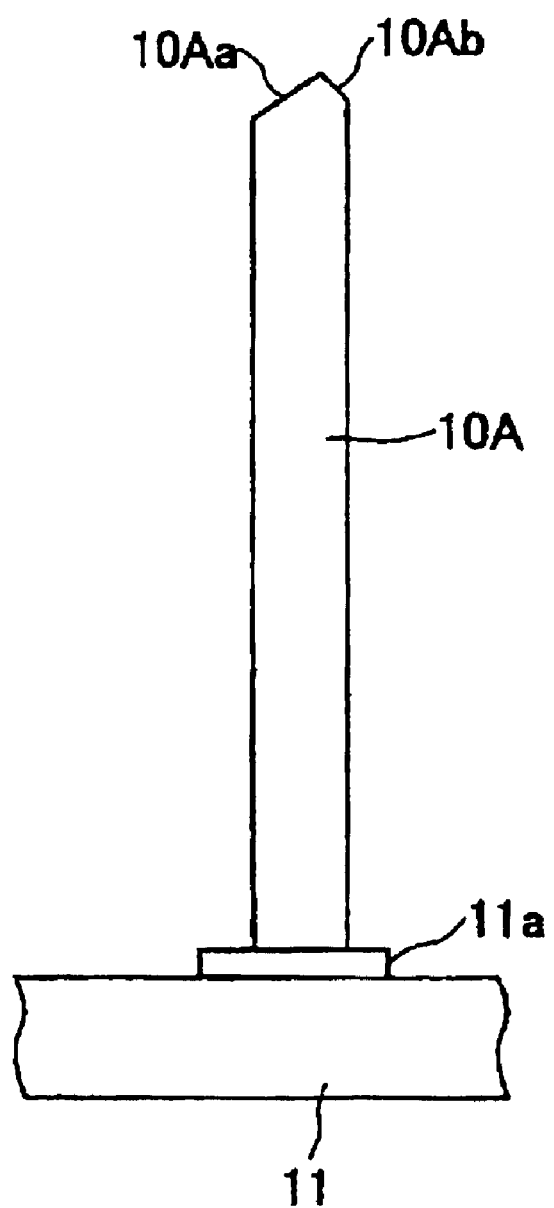
FIG. 57 shows a side elevation of a contact electrode, which is a modification of the first embodiment of the present invention, before being bent.
Figure 58:
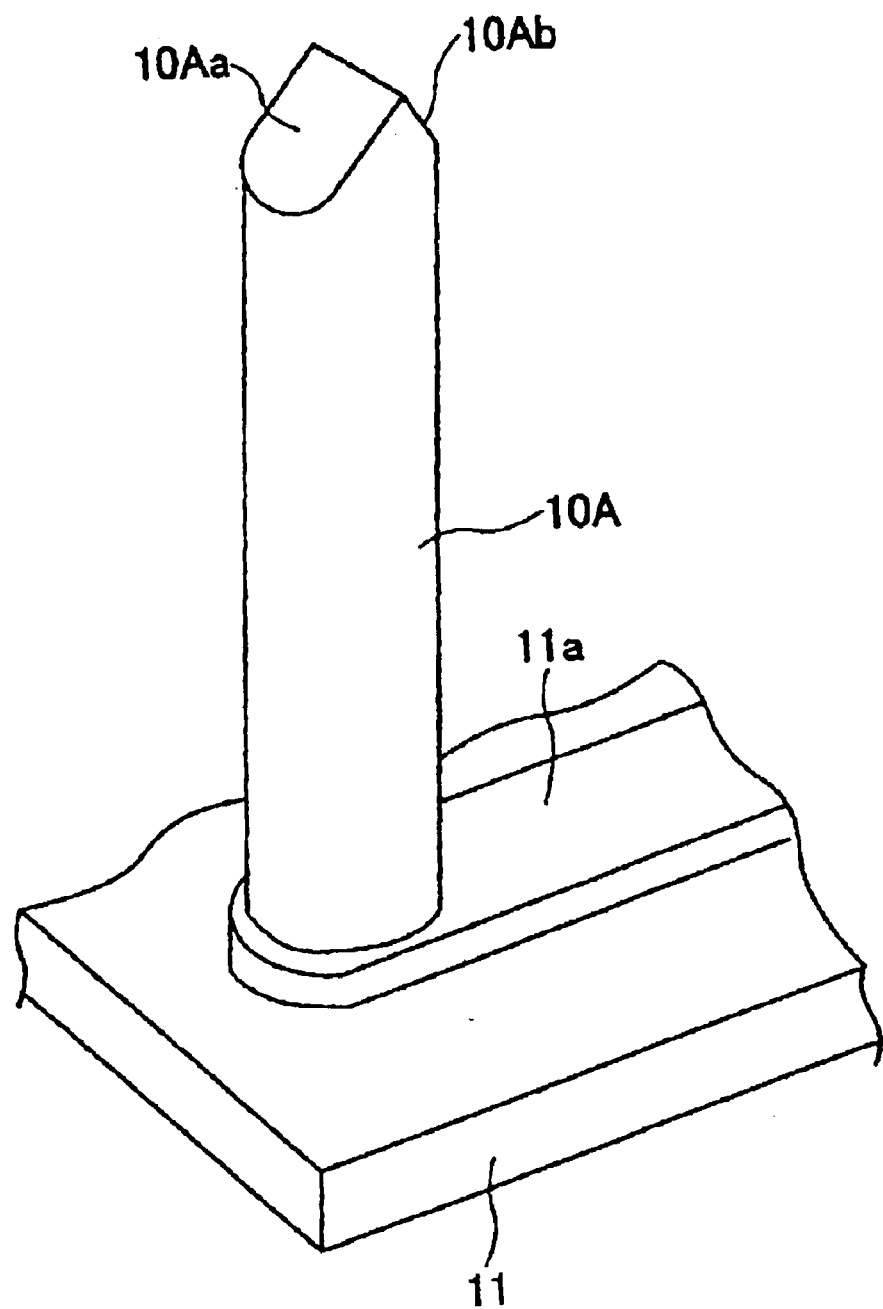
FIG. 58 shows a perspective view of the contact electrode shown in FIG. 57.
Figure 59:
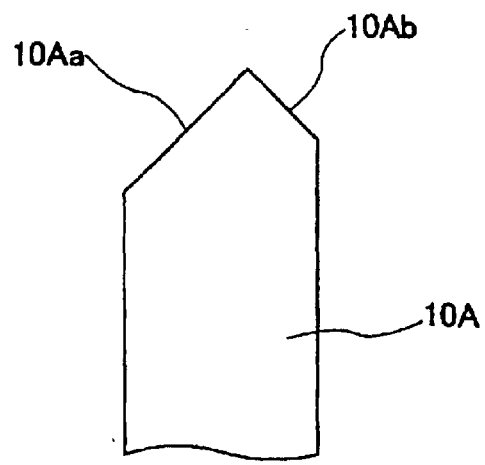
FIG. 59 shows an enlarged view of the apex portion of the contact electrode shown in FIG. 57.

In the following, a description on the modifications of the contact electrode according to the first embodiment and the second embodiment is given. FIG. 57 is a side elevation of a contact electrode 10A, which is a modification of the first embodiment mentioned above. Also, FIG. 58 is a perspective view of the contact electrode 10A and FIG. 59 is an enlarged view of the apex portion of the contact electrode 10A. The apex portion of the contact electrode 10A is formed with two inclined planes 10A$a$ and 10A$b$. The edge line (peak line) where two inclined plane 10A$a$ and 10A$b$ intersect deviates from the center of the contact electrode 10A as shown in FIG. 59. Therefore, two incline planes 10A$a$ and 10A$b$ have different dimensions one from another.

Figure 60:
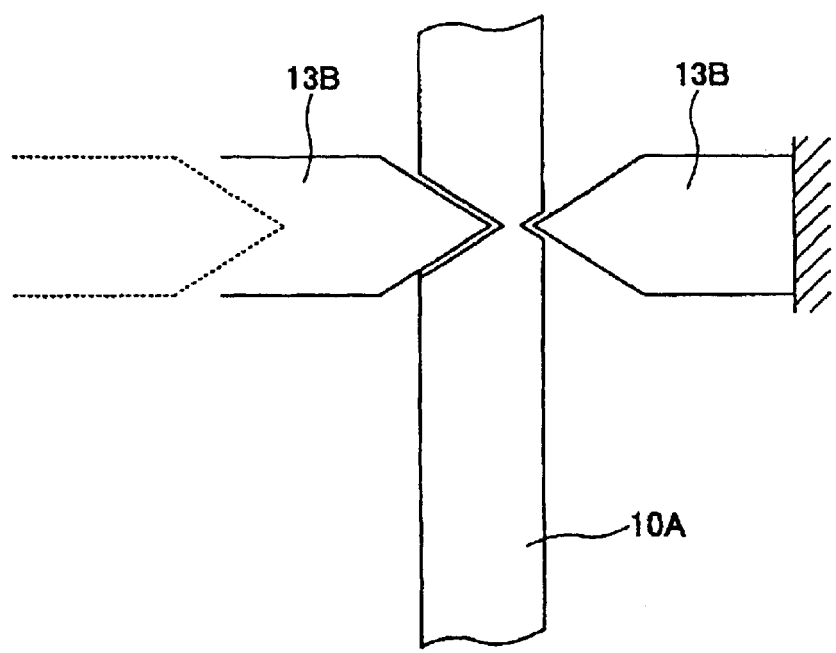
FIG. 60 is a diagram illustrating one example in the process of cutting the contact electrode shown in FIG. 57.

FIG. 60 shows one example in the cutting process of the contact electrode 10A shown in FIG. 57. As shown in FIG. 60, by making cuts into the rod-like member forming the contact electrode 10A from both sides of the contact electrode 10A by a pair of cutting tool 13B with inclined cutting edges, the contact electrode 10A is cut off. At this time, by making the cut by one of the cutting tool bigger than the cut by the other cutting tool, the edge line where the two inclined planes 10A$a$ and 10A$b$ intersect at the apex portion of the contact electrode 10A deviates from the center of the contact electrode 10A. Therefore, the dimensions of the inclined planes 10A$a$ and 10A$b$ differ one from another.

Figure 61:
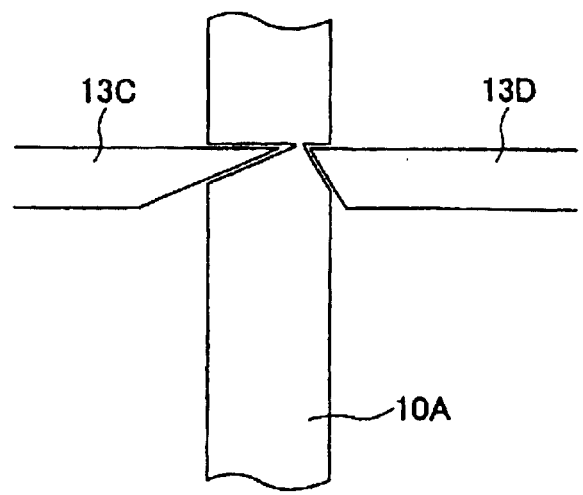
FIG. 61 is a diagram illustrating another example in the process of cutting off the contact electrode shown in FIG. 57.

FIG. 61 shows another example of the cutting process of the contact electrode 10A shown in FIG. 57. The cutting tool 13C and the cutting tool 13D have different cutting edge angles. In other words, the cutting edge angle of the cutting tool 13C has a smaller angle than that of the cutting tool 13D. Thus, when cuts are made from both sides of the rod-like member using the cutting tools 13C and 13D, the cutting tool 13C cuts into the rod-like member further. Therefore, the contact electrode 10A is formed with two inclined planes, the edge line where two inclined planes intersect deviating from the center, and cut off.

Figure 62A:
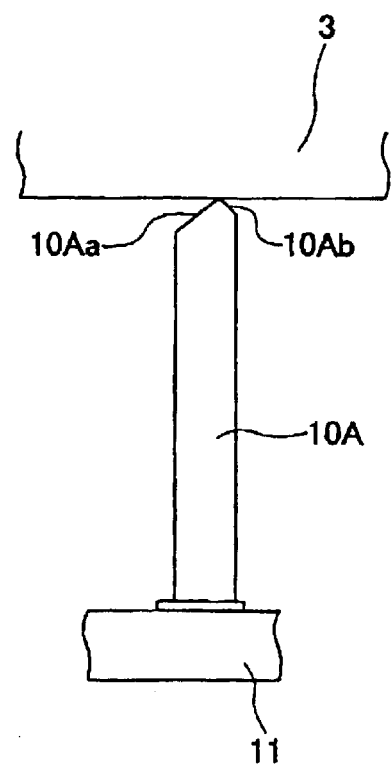
FIG. 62A and FIG. 62B are diagrams illustrating the bending process of the contact electrode shown in FIG. 57.
Figure 62B:
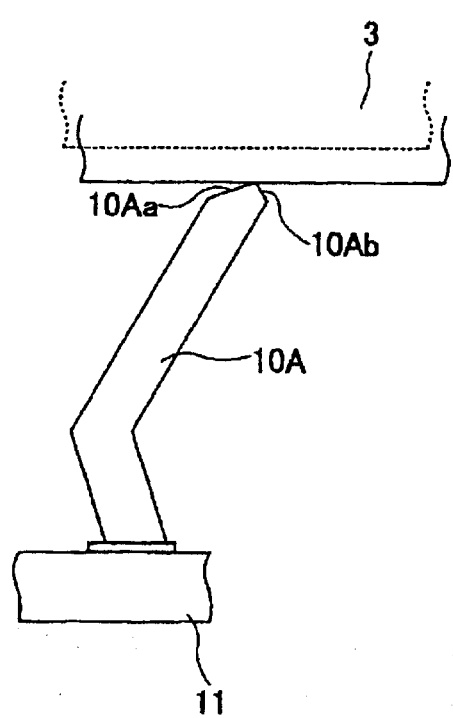

FIG. 62A and FIG. 62B show diagrams illustrating the bending process of the contact electrode 10A having the apex portion formed as mentioned above. As shown in FIG. 62A, when the depressing jig 3 is depressed against the apex portion of the contact electrode 10A, the contact electrode 10A buckles and bends in the direction of the inclined plane 10A$a$ with the larger dimension so as to follow the depressing plane movement of the depressing jig 3 as shown in FIG. 62B.

It is noted that the above-mentioned modification is described with reference to the first embodiment according to the present invention but it can obviously be applied to the second embodiment according to the present invention where the contact electrode is formed by the metal wire, and thus the description of which is omitted.

The above-mentioned contactor is described as being used for testing mainly semiconductor devices, however, it is not limited to the use of testing and it can also be used for applications in which the contactor contacts the terminals of electronic components semi-permanently.

Further, the present invention is not limited to the above-described embodiments, and variations and modifications may be made without departing from the scope of the present invention.

The present application is based on Japanese priority application No. 2002-099133, filed on Apr. 1, 2002, the entire contents of which are hereby incorporated by reference.

What is claimed is:

1. A contactor comprising:
   a wiring substrate; and
   a plurality of contact electrodes formed on said wiring substrate, wherein
   each of said plurality of contact electrodes is a rod-like member having one end joined to said wiring substrate;

a contact end located at the other end from the end joined to said wiring substrate of each of said plurality of contact electrodes has at least two straight inclined planes formed thereon; and a fracture surface formed at an apex by said at least two inclined planes deviates from a center of a cross section of said rod-like member.

2. The contactor as claimed in claim 1, wherein said at least two inclined planes at the other end of each of said plurality of contact electrodes comprise a cutting surface formed by a cut and the fracture surface formed by a tension fracture.

3. The contactor as claimed in claim 1, wherein each of said plurality of contact electrodes is a bent rod-like member.

4. The contactor as claimed in claim 2, wherein said fracture surface of each of said plurality of contact electrodes is a portion located farthest from said one end joined to said wiring substrate.

5. The contactor as claimed in claim 1, wherein said at least two inclined planes of each of said plurality of contact electrodes are inclined with a predetermined angle with respect to a surface of said wiring substrate.

6. A contactor comprising:
a wiring substrate; and
a plurality of contact electrodes formed on said wiring substrate, wherein
each of said plurality of contact electrodes is a rod-like member having one end joined to said wiring substrate;
the other end of each of said plurality of contact electrodes has at least two inclined planes; and
an apex formed by said at least two inclined planes deviates from a center of a cross section of said rod-like member,
wherein said rod-like member is a non-conductive member having a conductive coating formed on a surface of said rod-like member.

7. The contactor as claimed in claim 1, wherein said rod-like member is a conductive member.

8. The contactor as claimed in claim 7, wherein said conductive member is a metal wire.

9. The contactor as claimed in claim 8, wherein said metal wire is made of gold or a gold alloy.

10. The contactor as claimed in claim 8, wherein said metal wire is made of a platinum-based metal or a platinum-based metal alloy.

11. The contactor as claimed in claim 7, wherein a conductive coating is formed on said conductive member.

12. The contactor as claimed in claim 11, wherein said conductive coating is formed for reinforcing the strength of each of said plurality of contact electrodes.

13. The contactor as claimed in claim 11, wherein said conductive coating is formed for increasing the resilience of each of said plurality of contact electrodes.

14. The contactor as claimed in claim 1, wherein a periphery surface of each of said plurality of contact electrodes is covered by an insulative coating except for an apex portion of each of said plurality of contact electrodes.

15. The contactor as claimed in claim 1, wherein a reinforcing coating is provided at a joining portion of each of said plurality of contact electrodes and said wiring substrate.

16. The contactor as claimed in claim 1, wherein a coating for antisepsis or antioxidation is provided on a periphery surface of each of said plurality of contact electrodes.

17. The contactor as claimed in claim 1, wherein an insulative protrusion member is formed on a part of each of said plurality of contact electrodes.

18. The contactor as claimed in claim 1, wherein a position of said the other end of each of said plurality of contact electrodes and a position of said one end joined to said wiring substrate are located on a vertical line with respect to a surface of said wiring substrate.

19. The contactor as claimed in claim 1, wherein a position of said the other end of each of said plurality of contact electrodes is displaced by a predetermined distance in a direction parallel to a surface of said wiring substrate with respect to a position of said one end joined to said wiring substrate.

20. The contactor as claimed in claim 1, wherein a member with good contactability with a subject to be contacted is provided at an apex portion of each of said plurality of contact electrodes.

21. A contactor comprising:
wiring substrate; and
a plurality of contact electrodes formed on said wiring substrate, wherein
each of said plurality of contact electrodes is a rod-like member having one end joined to said wiring substrate;
the other end of each of said plurality of contact electrodes has at least two inclined planes; and
an apex formed by said at least two inclined planes deviates from a center of a cross section of said rod-like member,
wherein the coefficient of linear expansion of a material forming said wiring substrate is the same as the coefficient of linear expansion of a material forming a subject to be tested.

22. A method for manufacturing a contactor, said method comprising the steps of:
joining one end of each of a plurality of conductive rod-like members having the other end formed with a straight inclined plane to a wiring substrate; and
depressing an apex portion having a fractured surface of said inclined plane by a flat surface of a depressing member so as to bend said plurality of conductive rod-like members, thereby forming said plurality of conductive rod-like members as a plurality of contact electrodes.

23. The method as claimed in claim 22, further comprising the steps of:
forming a cut into a consecutive conductive rod-like member by a cutting tool having an angle corresponding to an incline of said inclined plane;
joining said conductive rod-like member provided with said cut to said wiring substrate; and
fracturing said consecutive conductive rod-like member at a position where said cut is provided by pulling a portion of said consecutive conductive rod-like member located farthest from said one end joining said conductive rod-like member to said wiring substrate.

24. The method as claimed in claim 23, wherein said step of forming a cut is performed at a position different from a position where said step of joining said conductive rod-like member provided with said cut to said wiring substrate is performed.

25. The method as claimed in claim 24, wherein by providing a smaller cut than said cut at a predetermined position of said conductive rod-like member, said conductive rod-like member is bent at said predetermined position where said smaller cut is provided in said step of depressing by said depressing member.

26. The method as claimed in claim 22, wherein said plurality of conductive rod-like members is depressed by said depressing member with said apex portion of each of said plurality of conductive rod-like members inserted in a corresponding concave portion provided in said depressing member.

27. The method as claimed in claim 22, wherein a laser beam is irradiated to a portion of said plurality of conductive rod-like members, after said plurality of conductive rod-like members are bent by said depressing member, so as to modify the characteristic or the shape of each of said plurality of conductive rod-like members.

28. The method as claimed in claim 22, wherein heat treatment is applied to said plurality of contact electrodes, after being formed, so as to improve stress resistance.

29. A semiconductor device testing socket comprising:
a socket body for accommodating a semiconductor device;
a depressing lid for depressing said semiconductor device accommodated in said socket body; and
a contact electrode provided in said socket body for contacting an electrode of said semiconductor device, wherein
said contact electrode having a contact end located at the other end from the end provided in the socket body of the contact electrode having a straight inclined plane formed thereon and a fracture surface formed at an apex of said straight inclined plane.

said contact electrode is formed by a bending conductive rod-like member,
said contact electrode applies contact pressure by resiliently deforming when said electrode is depressed against one end of said contact electrode with said semiconductor device being depressed.

30. A probe card comprising a contactor as claimed in claim 1.

31. A method of performing a test, while obtaining electrical conductivity with a subject to be tested, using a contactor as claimed in claim 1.

32. The method as claimed in claim 31, wherein an activation treatment is applied to a contacting portion of said subject to be tested before placing said contactor in contact with said subject to be tested so as to remove reducing substances or organic substances attached to said contacting portion.

33. The method as claimed in claim 31, wherein a coating of conductive material less oxidizable is applied to a contacting portion of said subject to be tested before placing said contactor in contact with said subject to be tested.

34. The method as claimed in claim 33, wherein said coating is peeled off after the test.

* * * * *